United States Patent
Cho et al.

(10) Patent No.: US 11,788,672 B2
(45) Date of Patent: Oct. 17, 2023

(54) DISPLAY APPARATUS

(71) Applicant: LG Display Co., Ltd., Seoul (KR)

(72) Inventors: Seokhyo Cho, Goyang-si (KR); Yongjoon Jeon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 56 days.

(21) Appl. No.: 17/393,094

(22) Filed: Aug. 3, 2021

(65) Prior Publication Data

US 2022/0042642 A1  Feb. 10, 2022

(30) Foreign Application Priority Data

Aug. 7, 2020 (KR) .................. 10-2020-0099477

(51) Int. Cl.
| | |
|---|---|
| *H05K 5/00* | (2006.01) |
| *F16M 11/12* | (2006.01) |
| *F16M 11/18* | (2006.01) |
| *H05K 5/02* | (2006.01) |
| *F16M 11/04* | (2006.01) |

(52) U.S. Cl.
CPC ......... *F16M 11/125* (2013.01); *F16M 11/046* (2013.01); *F16M 11/18* (2013.01); *H05K 5/0017* (2013.01); *H05K 5/0226* (2013.01)

(58) Field of Classification Search
None
See application file for complete search history.

(56) References Cited

U.S. PATENT DOCUMENTS

| | | | |
|---|---|---|---|
| 7,336,478 B2* | 2/2008 | Jang | G06F 1/1601 248/920 |
| 7,793,898 B2* | 9/2010 | Dong | F16M 11/24 248/404 |
| 9,010,707 B2* | 4/2015 | In | A47G 1/164 248/295.11 |
| 9,360,151 B2 | 6/2016 | Chiang | |
| 11,132,019 B1* | 9/2021 | Cho | F16M 11/24 |
| 11,262,019 B2* | 3/2022 | Woo | H04M 1/04 |
| 11,340,651 B2* | 5/2022 | Lee | G06F 1/1618 |
| 2007/0064379 A1 | 3/2007 | Shin | |
| 2007/0205341 A1* | 9/2007 | Chih | F16M 11/18 248/920 |
| 2008/0076490 A1 | 3/2008 | Kosugi | |

(Continued)

FOREIGN PATENT DOCUMENTS

| | | |
|---|---|---|
| CN | 1971765 A | 5/2007 |
| CN | 1981139 A | 6/2007 |

(Continued)

*Primary Examiner* — Anthony Q Edwards
*Assistant Examiner* — Rashen E Morrison
(74) *Attorney, Agent, or Firm* — Birch, Stewart, Kolasch & Birch, LLP

(57) ABSTRACT

A display apparatus includes a display module displaying an image, a support assembly facing toward the display module, a driver installed on the support assembly for supplying power to rotate the display module, a linearly-movable assembly connected to the driver to receive power therefrom and configured to perform a linear movement in a first direction along the support assembly, and a rotation guiding mechanism that connects the linearly-movable assembly to the display module, and guides rotation of the display module using the movement of the linearly-movable assembly.

18 Claims, 28 Drawing Sheets

(56) References Cited

U.S. PATENT DOCUMENTS

2019/0318710 A1* 10/2019 Gurr .................... G06F 3/0325
2020/0081483 A1    3/2020 Laurent et al.
2020/0113073 A1    4/2020 Davies et al.
2020/0344902 A1* 10/2020 Choi ................... F16M 11/105

FOREIGN PATENT DOCUMENTS

| CN | 201237069 Y | 5/2009 |
| --- | --- | --- |
| CN | 103470929 A | 12/2013 |
| KR | 10-0911651 B1 | 8/2009 |
| KR | 10-2020-0050562 A | 5/2020 |

* cited by examiner

DISPLAY APPARATUS

CROSS-REFERENCE TO RELATED APPLICATION

This application claims the benefit priority under 35 U.S.C. § 119(a) to Korean Patent Application No. 10-2020-0099477 filed on Aug. 7, 2020, in the Korean Intellectual Property Office, the entire contents of which are expressly incorporated herein by reference for all purposes into the present application.

BACKGROUND OF THE INVENTION

1. Field of the Invention

The present disclosure relates to a display apparatus, and more particularly, to a display apparatus capable of providing various viewing modes.

2. Description of Related Art

In general, a flat panel display apparatus includes a liquid crystal display apparatus, a plasma display apparatus, a field emission display apparatus, an organic light emitting display apparatus, etc. which are actively studied. The liquid crystal display apparatus and the organic light emitting display apparatus are mainly used in terms of mass production technology, easiness of driving means, and high-definition implementation.

The conventional display apparatus may not provide various viewing modes because a screen that outputs an image can be fixed to a landscape mode.

SUMMARY OF THE INVENTION

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

A purpose of the present disclosure is to provide a display apparatus capable of providing various viewing modes.

Further, a purpose of the present disclosure is to provide a display apparatus capable of easily rotating a screen that outputs an image.

Purposes in accordance with the present disclosure are not limited to the above-mentioned purpose. Other purposes and advantages in accordance with the present disclosure as not mentioned above can be understood from following descriptions and more clearly understood from embodiments in accordance with the present disclosure. Further, it will be readily appreciated that the purposes and advantages in accordance with the present disclosure can be realized by features and combinations thereof as disclosed in the claims.

In a display apparatus according to the present disclosure, a linearly-movable assembly moves under an operation of the driver and then a rotation guiding mechanism induces rotation of the display module using movement of the linearly-movable assembly, such that a landscape viewing mode or a portrait viewing mode is selectively provided.

The present disclosure provides a display apparatus comprising a display module displaying an image, a support assembly facing toward the display module, a driver installed on the support assembly for supplying power to rotate the display module, a linearly-movable assembly connected to the driver to receive power therefrom and configured to perform a linear movement in a first direction along the support assembly, and a rotation guiding mechanism that connects the linearly-movable assembly to the display module, and guides rotation of the display module using the movement of the linearly-movable assembly.

The present disclosure also provides a display apparatus comprising a support assembly installed to face toward a display module displaying an image, a linearly-movable assembly performing linear movement under power from a driver installed on the support assembly, and a rotation guiding mechanism configured to connect the linearly-movable assembly to the display module, and to induce rotation of the display module using movement of the linearly-movable assembly.

Further, the rotation guiding mechanism is configured to guide the display module to rotate such that a viewing mode of the display module switches to a first mode or a second mode.

Moreover, the display module can include a display panel that displays an image and a plate-shaped support panel that is located on a rear face of the display panel and supports the display panel.

The display module can further include a first controller installed on the support panel and movable together with the support panel, wherein the first controller controls an operation of the display panel.

The support assembly can include a first support body positioned on the rear face of the display module, and a second controller fixed to the first support body and connected to the first controller.

The first controller can be located in front of the first support body, and the second controller can be located in rear of the first support body.

Moreover, a cable member connecting the first controller and the second controller can extend through the first support body.

The support assembly can include a first support body located on a rear face of the display module, a second support body facing toward the first support body, and a hinge-type connector connected to the first support body and the second support body, wherein each of the first support body and the second support body pivots around the hinge-type connector.

Each of the first support body and the second support body can extend in the first direction, and can be formed in a shape of a plate.

Moreover, a hook receiving groove can be defined in a side face of the second support body, wherein a wall-mounted hook can be inserted into the groove.

The support assembly can further include a guiding member which is located inwardly of the first support body for guiding the linear movement of the linearly-movable assembly in the first direction.

The guiding member can include a guide rail extending along a moving path of the linearly-movable assembly, and a guide hole defined on each of both opposing sides of the guide rail, wherein the guide hole is elongate along the guide rail.

The linearly-movable assembly can be constructed to extend through the guide hole and surround the guide rail, and move in the first direction and along the guide rail.

The linearly-movable assembly can include a screw bar rotating upon receiving the power of the driver, wherein a thread is formed on an outer face of the screw bar, a ball nut engaged with the thread and installed on the outer face of the screw bar, wherein the ball nut moves in the first direction under rotation of the screw bar, a first movable body coupled to the ball nut and movable together with the ball nut and along the guide rail, and a second movable body extending through the guide hole and having one side connected to the first movable body, and the opposite side connected to the rotation guiding mechanism.

The first movable body can include a movable bracket connected to the ball nut and movable, in the first direction, together with the ball nut, and a movable block caught on an outer face of the guide rail, and constructed to slide along the guide rail, and connected to the movable bracket.

The guide rail includes a pair of guide rails arranged side by side and extending in the first direction, wherein the movable block includes a pair of movable blocks, wherein each movable block is constructed to be caught on the outer face of each guide rail.

The second movable body can include a slidable body installed to face toward the first movable body while the support assembly is interposed therebetween, a side member extending from each of both opposing sides of the slidable body and toward the first movable body, wherein the side member is fixed to the first movable body, and a rotation support shaft protruding from the slidable body toward the display module.

The rotation guiding mechanism can include a rotatable cam structure rotatably coupled to the linearly-movable assembly, and including a plurality of protrusions, a rotation-inducing protrusion located in a movement path of the rotatable cam structure, wherein the rotation-inducing protrusion contacts the rotatable cam structure to induce rotation of the rotatable cam structure, and a guiding assembly fixed to the support assembly and extending along the movement path of the rotatable cam structure, wherein the guiding assembly is in contact with a side face of the rotatable cam structure to induce the rotation of the rotatable cam structure such that the viewing mode of the display module switches to the first mode or the second mode.

The first mode can be a landscape viewing mode in which a horizontal dimension of the display module is larger than a vertical dimension of the display module, wherein the second mode can be a portrait viewing mode in which the horizontal dimension of the display module is smaller than the vertical dimension of the display module.

The rotatable cam structure can include a cam body having a cam hole defined therein and rotatably coupled to the linearly-movable assembly, a first cam protrusion protruding outwardly from the cam body, and a second cam protrusion protruding outwardly from the cam body, wherein protrusion extensions of the first cam protrusion and the second cam protrusion intersect with each other, wherein the first cam protrusion, or the second cam protrusion is caught on and thus rotates by the rotation-inducing protrusion.

The guiding assembly can include a first guiding protrusion installed to be opposite to the rotation-inducing protrusion while the rotatable cam structure is disposed therebetween, wherein the first guiding protrusion extends in a first direction, and comes into contact with the rotatable cam structure to guide movement of the rotatable cam structure moving in the first direction, a second guiding protrusion located on one end of the first guiding protrusion, and extending in a second direction intersecting the first direction, wherein the second guiding protrusion guides the rotatable cam structure to rotate such that the viewing mode is brought into the first mode, and a third guiding protrusion located on the opposite end of the first guiding protrusion, and extending in the second direction intersecting the first direction, wherein the third guiding protrusion guides the rotatable cam structure to rotate such that the viewing mode is brought into the second mode.

The second guiding protrusion and the third guiding protrusion extend in a parallel manner to each other and are opposite to each other, and extend in the second direction intersecting the first direction.

The rotation guiding mechanism can further include a panel connector for connecting the rotatable cam structure to the display module, and for synchronizing rotations of the rotatable cam structure and the display module with each other.

The panel connector can include a swing bracket fixed to a face of the display module facing toward the rotatable cam structure, a first fixed member fixed to the swing bracket, and a second fixed member fixed to a face of the rotatable cam structure facing toward the first fixed member.

Moreover, at least one of the first fixed member or the second fixed member can have magnetism, and can be fixed to a corresponding component using a magnetic force.

The panel connector can include a fixed connector member having one side inserted into the swing bracket and the opposite side inserted into the rotatable cam structure.

According to the present disclosure, the display module can rotate to switch to a landscape viewing mode or a portrait viewing mode, or to switch between a plurality of different viewing modes. Thus, various consumer preferences can be satisfied.

When the rotatable cam structure receives the power of the driver, the rotation of the cam can be guided by the rotation-inducing protrusion and the guiding assembly. Thus, the rotation of the display module that outputs the image is easily made. Thus, the time and cost needed for the rotation of the display module can be saved.

Since the support assembly supporting the display module can be changed to a standing mode or the wall-mounted mode, an installation cost can be reduced.

Since the first and second controllers are respectively installed on the display module and the support assembly, the display module can be lightened and a simple maintenance structure can be provided, thereby reducing the maintenance cost.

The rotatable cam structure which can move under the power of the driver, and the swing bracket connected to the display module are interconnected to each other under the magnetic force and using the fitting structure, thus reducing the time and cost needed for removing the display module therefrom.

In addition to the effects as described above, specific effects in accordance with the present disclosure will be described together with following detailed descriptions for carrying out the disclosure.

BRIEF DESCRIPTION OF THE DRAWINGS

The present disclosure will become more fully understood from the detailed description given hereinbelow and the accompanying drawings which are given by way of illustration only, and thus are not limitative of the present disclosure and wherein.

DETAILED DESCRIPTION OF THE EMBODIMENTS

Figure 1:
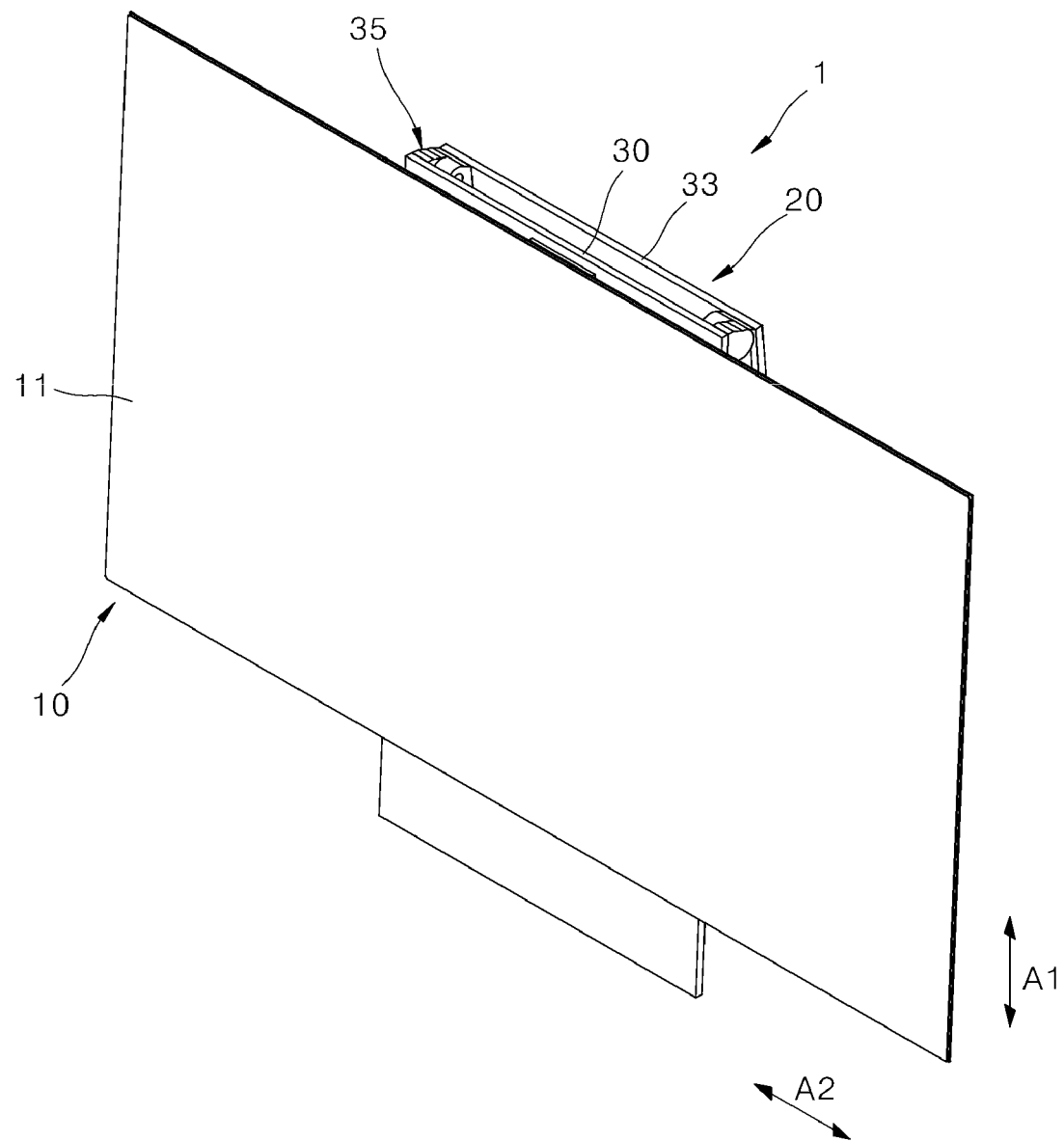
FIG. 1 is a perspective view showing a front face of a display apparatus according to a first embodiment of the present disclosure.

For simplicity and clarity of illustration, elements in the figures are not necessarily drawn to scale. The same reference numbers in different figures represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as can be included within the spirit and scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entirety of list of elements and may not modify the individual elements of the list. When referring to "C to D", this means C inclusive to D inclusive unless otherwise specified.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element can be disposed directly on or beneath the second element or can be disposed indirectly on or beneath the second element with a third element or layer being disposed between the first and second elements or layers.

It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display apparatus according to some embodiments of the present disclosure will be described. All the components of each display apparatus according to all embodiments of the present disclosure are operatively coupled and configured.

A display apparatus 1 according to a first embodiment of the present disclosure can include at least one of a display module 10, a support assembly 20, a driver 50, a linearly-movable assembly 60, and a rotation guiding mechanism 90.

Display Module

FIG. 1 is a perspective view showing a front face of the display apparatus 1 according to the first embodiment of the present disclosure.

Figure 2:
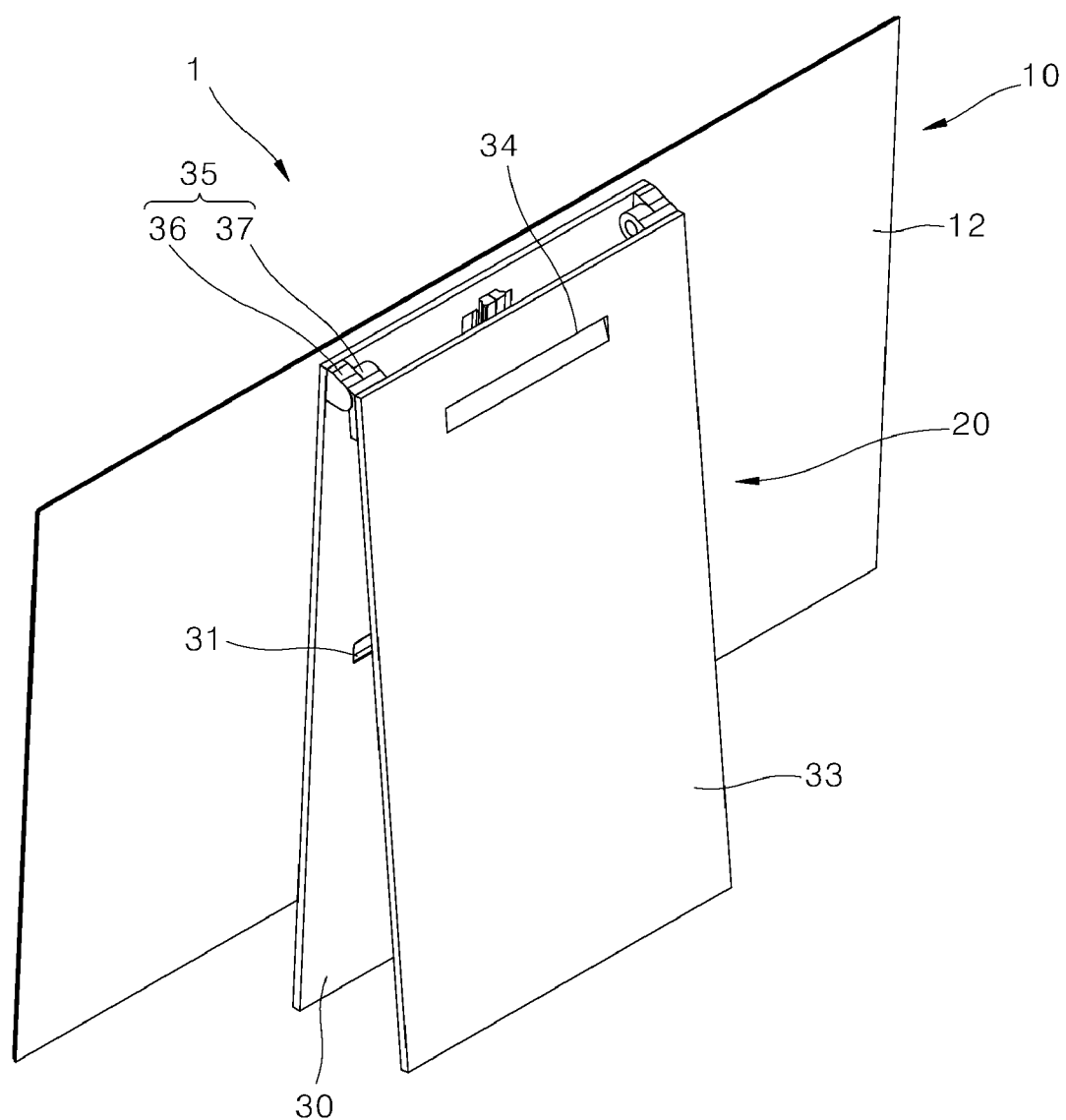
FIG. 2 is a perspective view showing a rear face of the display apparatus according to the first embodiment of the present disclosure.
Figure 3:
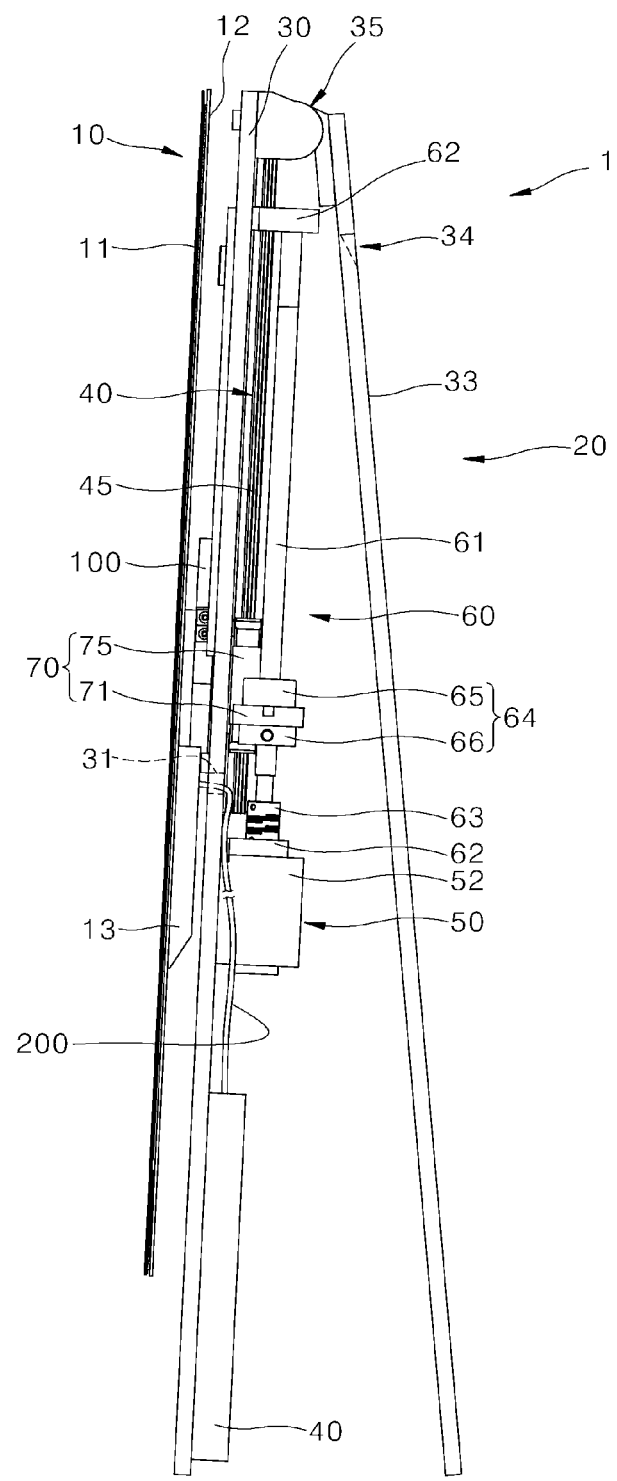
FIG. 3 is a side view of a display apparatus according to the first embodiment of the present disclosure.

FIG. 2 is a perspective view showing the rear surface of the display apparatus 1 according to the first embodiment of the present disclosure. FIG. 3 is a side view of the display apparatus 1 according to the first embodiment of the present disclosure.

As shown in FIGS. 1 to 3, the display module 10 according to the first embodiment of the present disclosure can include at least one of a display panel 11, a support panel 12, and a first controller 13.

The display panel 11 can be modified in a variety of ways as long as the panel 11 displays an image. The display panel 11 according to the first embodiment of the present disclosure outputs an image frontwards. When necessary, the panel 11 can output an audio together with the image. The display panel 11 can be formed in a shape of a rectangular thin plate.

The support panel 12 is located on a rear face of the display panel 11 and has a plate shape that supports the display panel 11. The first controller 13 can be installed on the support panel 12 to control an operation of the display panel 11.

The first controller 13 can be fixed to a rear face of the support panel 12, and can perform a motion such as vertical movement and rotation together with a motion of the support panel 12.

The display module 10 can rotate into a first mode or a second mode while the rotation thereof can be guided by the rotation guiding mechanism 90.

The display module 10 can move up and down using or by the linearly-movable assembly 60 in the first mode, and thus a vertical level thereof can be adjusted. Moreover, the display module 10 can move upward using or by the linearly-movable assembly 60 and then is rotated to convert a viewing mode from the first mode to the second mode.

The first mode can refer to a landscape viewing mode in which a horizontal dimension of the display module 10 is larger than a vertical dimension of the display module 10. Moreover, the second mode can refer to a portrait viewing mode in which the horizontal dimension of the display module 10 is smaller than the vertical dimension of the display module 10.

Support Assembly

The support assembly 20 can be modified in various ways as long as the assembly 20 faces toward the display module 10, and supports the display module 10 so as to be rotatable. The support assembly 20 according to the first embodiment of the present disclosure can include at least one of a first support body 30, a second support body 33, a hinge-type connector 35, a second controller 40, and a guiding member 43.

The support assembly 20 according to the first embodiment of the present disclosure can include the first support body 30, the second support body 33, and the hinge-type connector 35. The first support body 30 and the second support body 33 can pivot around the hinge-type connector 35. An angle between the first support body 30 and the second support body 33 is within an acute angle range. A standing mode is available when a spacing between the first support body 30 and the second support body 33 is maintained. Since bottoms of the first support body 30 and the second support body 33 are installed on a mount surface, the first support body 30 and the second support body 33 stand on the mount surface while an angular spacing between the first support body 30 and the second support body 33 is maintained.

Alternatively, when the angular spacing between the first support body 30 and the second support body 33 is zero, the display apparatus can be used in a wall-mounted mode.

The first support body 30 can be modified in various ways as long as the body 30 is located on a rear face of the display module 10, and the driver 50, the linearly-movable assembly 60, and the rotation guiding mechanism 90 are installed thereon. The second support body 33 is installed to face toward the first support body 30. Each of the first support body 30 and the second support body 33 according to the first embodiment of the present disclosure can extend in a first direction (A1) and can be formed in a shape of a plate.

The hinge-type connector 35 can be modified in a variety of ways as long as the connector 35 connects to the first support body 30 and the second support body 33 while the first support body 30 and the second support body 33 are pivotable around the connector 35. The hinge-type connector 35 according to the first embodiment of the present disclosure includes a first connector member 36 connected to a top of the first support body 30 and a second connector member 37 connected to a top of the second support body 33. Since the first connector member 36 is installed to be pivotable relative to the second connector member 37, the second connector member 37 and the second support body 33 can pivot around the first connector member 36.

The second controller 40 is fixed to the first support body 30, and is connected to the first controller 13 via a cable member 200. A weight of the second controller 40 is larger than that of the first controller 13, and the second controller 40 has a larger volume than that of the first controller 13. The first controller 13 can control an operation of the display module 10. The second controller 40 controls an operation of the driver 50, receives external signals, and control the operation of the display module 10 in cooperation with the first controller 13. Since the first controller 13 and the second controller 40 are separated from each other, a time and a cost for maintenance and replacement thereof can be saved. Moreover, the weight of the display module 10 is reduced, so that the rotation of the display module 10 can be easily performed.

The first controller 13 according to the first embodiment of the present disclosure can be located in front of the first support body 30, and the second controller 40 can be located on the rear face of the first support body 30. Moreover, the cable member 200 connecting the first controller 13 and the second controller 40 to each other can pass through the first support body 30. The first support body 30 has a cable receiving hole 31 for receiving the cable member 200. Therefore, since the cable member 200 passes through the receiving hole 31 and connects the first controller 13 and the second controller 40 to each other, an installation length of the cable member 200 can be reduced and a production cost can be reduced.

In one example, a side face of the second support body 33 has a hook receiving groove 34 for receiving a hook to realize a wall-mounted mode. The hook receiving groove 34 according to the first embodiment of the present disclosure can be embodied as a belt-shaped groove defined in the rear face of the second support body 33 and extending in a horizontal direction. Moreover, since the hook receiving groove 34 is concave toward an inside of the second support body 33, the hook can be easily caught on the hook receiving groove 34.

Figure 4:
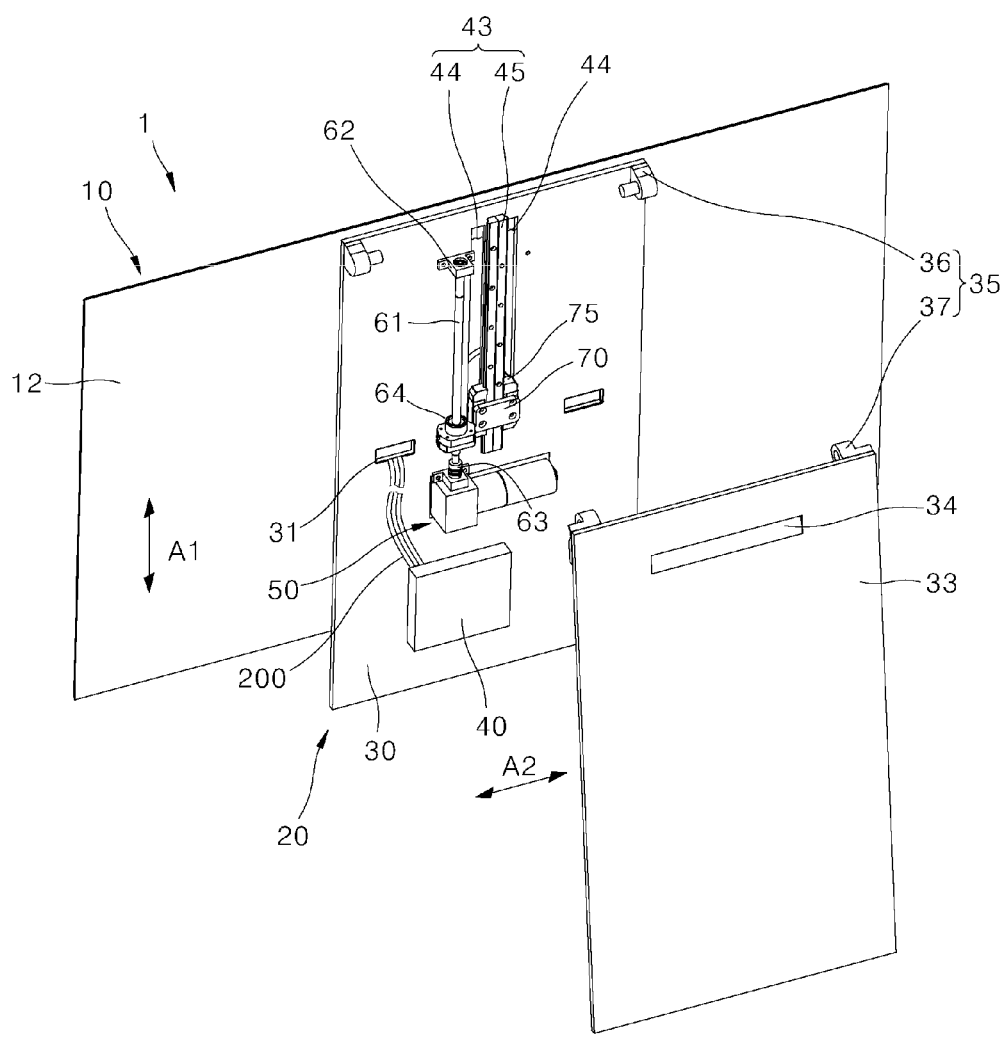
FIG. 4 is a perspective view showing a state in which a second support body is separated from a first support body according to the first embodiment of the present disclosure.
Figure 5:
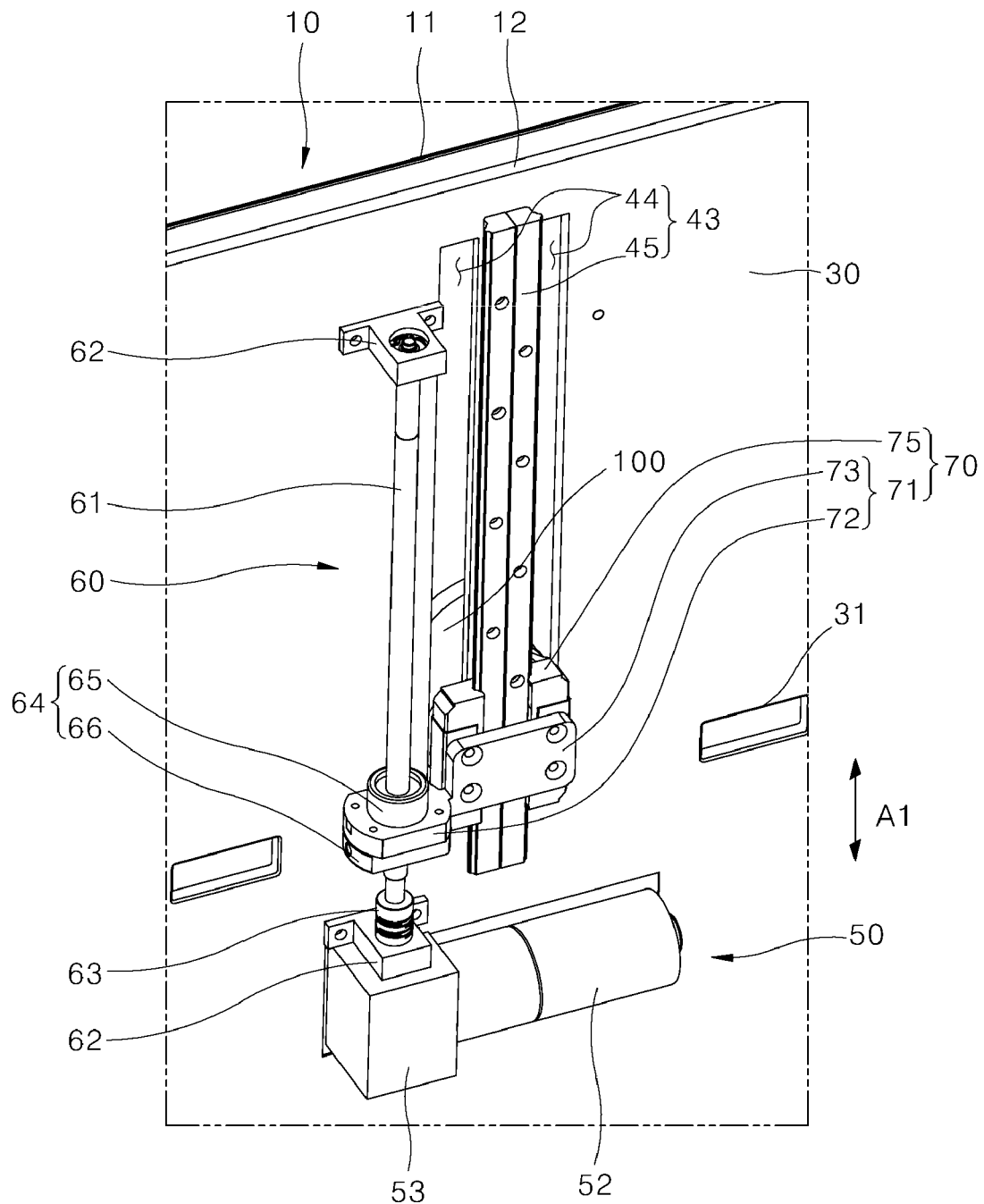
FIG. 5 is a perspective view showing a driver and a linearly-movable assembly according to the first embodiment of the present disclosure.
Figure 6:
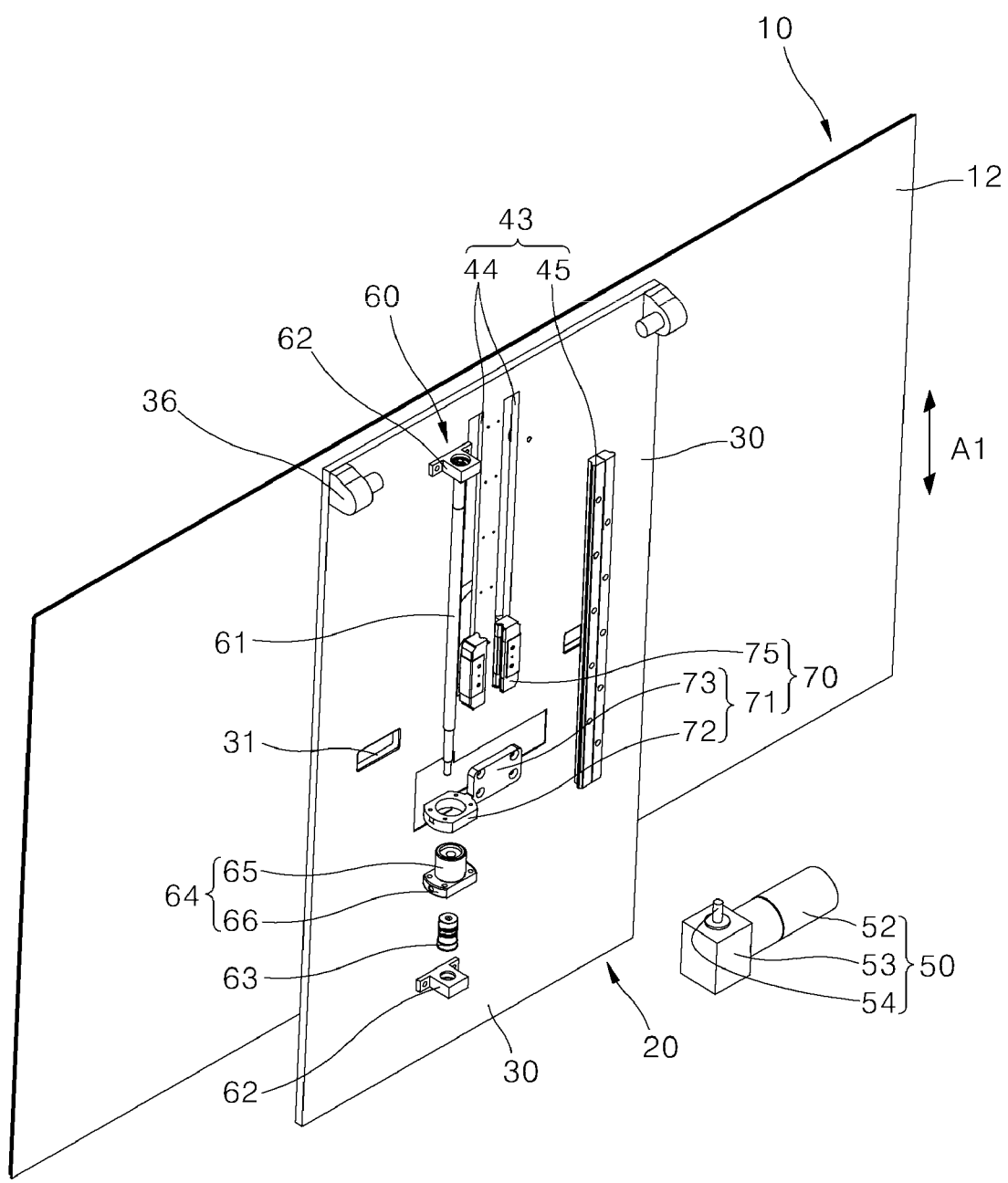
FIG. 6 is a perspective view showing a state in which the linearly-movable assembly is separated from a first support body according to the first embodiment of the present disclosure.
Figure 7:
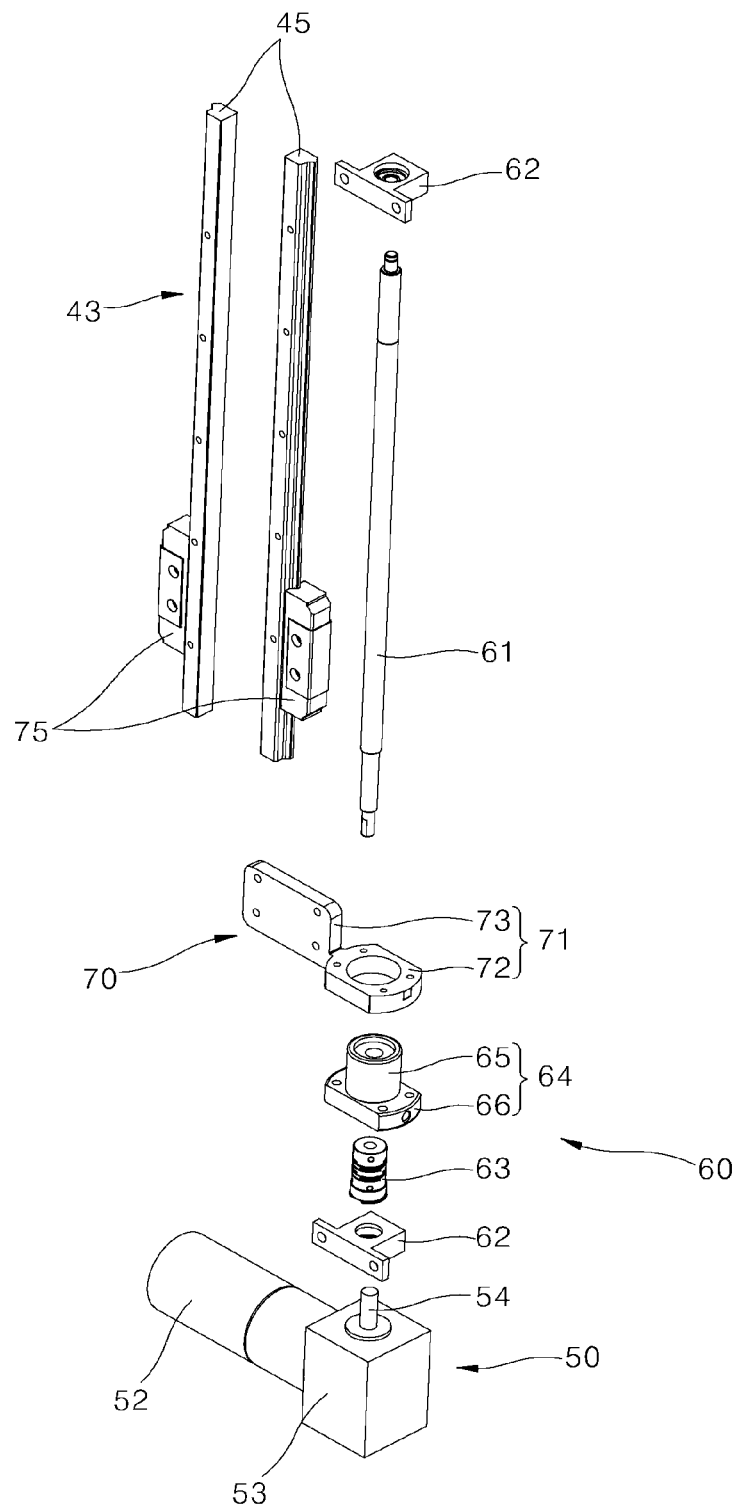
FIG. 7 is an exploded perspective view of the linearly-movable assembly according to the first embodiment of the present disclosure.

FIG. 4 is a perspective view showing a state in which the second support body 33 is separated from the first support body 30 according to the first embodiment of the present disclosure. FIG. 5 is a perspective view showing the driver 50 and the linearly-movable assembly 60 according to the first embodiment of the present disclosure. FIG. 6 is a perspective view showing a state in which the linearly-movable assembly 60 is separated from the first support body 30 according to the first embodiment of the present disclosure. FIG. 7 is an exploded perspective view of the linearly-movable assembly according to the first embodiment of the present disclosure.

As shown in FIGS. 4 to 7, the support assembly 20 according to the first embodiment of the present disclosure can further include a guiding member 43 guiding a linear movement of the linearly-movable assembly 60 in the first direction (A1).

In the first embodiment of the present disclosure, the first direction (A1) can be a vertical direction, while a second direction (A2) is a left and right direction or a horizontal direction. Further, the first direction (A1) and the second direction (A2) can intersect each other. Further, the first direction (A1) and the second direction (A2) can intersect each other at a right angle.

The guiding member 43 according to the present disclosure can include a guide hole 44 and a guide rail 45. The guide rail 45 can be modified in various ways as long as the rail extends along a movement path of the linearly-movable assembly 60 and guides the movement of a first movable body 70 in the first direction (A1). The guide rail 45 according to the first embodiment of the present disclosure protrudes from a rear face of the first support body 30, and can include a plurality of guide rails extending in a parallel manner to each other.

The guide hole 44 is formed on each of both opposing sides of the guide rail 45 and extends along the guide rail. The guide hole 44 is an elongate hole that extends in the first direction (A1), and is defined on each of both opposing sides of the guide rail 45. Moreover, the linearly-movable assembly 60 can have a structure passing through the vertically elongate guide hole 44 and surrounding the guide rail 45, and can move in the first direction (A1) along the guide rail 45. Therefore, the linearly-movable assembly 60 can move up and down more stably.

Driver

The driver 50 can be modified in a variety of ways as long as the driver is installed on the support assembly 20 and supplies power to rotate the display module 10. The driver 50 according to the first embodiment of the present disclosure includes a driving motor 52 and a driving shaft 54. A transmission 53 can be additionally installed at the driving motor 52. The driving motor 52 can be embodied as a servo motor. Alternatively, other types of electric motors that generate rotational power using electric energy can also be used as the driving motor 52. An output shaft can be directly connected to the driving motor 52. The driving shaft 54 can be installed at an output side of the transmission 53 that receives the power of the driving motor 52 and changes a rotation speed. The driver 50 can be fixedly installed on the rear of the first support body 30.

Linearly-Movable Assembly

The linearly-movable assembly 60 can be modified in various ways as long as the assembly 60 is connected to the driver 50 to receive the power therefrom, and linearly moves along the support assembly 20 in the first direction (A1). The linearly-movable assembly 60 according to the first embodiment of the present disclosure can include at least one of a screw bar 61, a bearing holder 62, a coupling member 63, a ball nut 64, a first movable body 70, and a second movable body 80.

The screw bar 61 can be modified in various ways as long as the bar 61 rotates upon receiving the power of the driver 50, and a thread is formed on an outer face thereof. The screw bar 61 according to the first embodiment of the present disclosure extends in the first direction (A1) as the vertical direction, and has a rod shape.

The bearing holder 62 is installed on each of the upper and lower ends of the screw bar 61 and supports the screw bar 61 so as to be rotatable. The bearing holder 62 is fixed to the rear face of the first support body 30, and a bearing is installed on an inner face of the holder 62 facing toward the screw bar 61.

The coupling member 63 can be modified in a variety of ways as long as the member 63 functions as a connector connecting the driving shaft 54 to the screw bar 61. The coupling member 63 according to the first embodiment of the present disclosure can extend in the first direction (A1). The driving shaft 54 is inserted into a lower portion thereof, while the screw bar 61 is inserted into an upper portion thereof. Therefore, rotations of the driving shaft 54, the coupling member 63 and the screw bar 61 are synchronized with each other.

The ball nut 64 can be modified in a variety of ways as long as the nut 64 engages with the thread and surrounds an outer face of the screw bar 61 and is moveable in the first direction (A1) under rotation of the screw bar 61. The ball nut 64 according to the first embodiment of the present disclosure includes a ball nut body 65 and a wing 66.

The ball nut body 65 extends in the first direction (A1), and has a hollow receiving the screw bar 61 and extending in the first direction (A1). Moreover, a female thread is formed on an inner face of the ball nut body 65 facing toward the screw bar 61, and is engaged with a male thread provided on the outer face of the screw bar 61.

The wing 66 has a plate shape extending outwardly from the ball nut body 65. A movable bracket 71 of the first movable body 70 is fixed to the wing 66.

The first movable body 70 can be modified in a variety of ways as long as the body 70 is coupled to the ball nut 64, and moves together with the ball nut 64, and is movable along the guide rail 45. The first movable body 70 according to the first embodiment of the present disclosure includes the movable bracket 71 and a movable block 75.

The movable bracket 71 can be modified in a number of ways as long as the bracket 71 connects to the ball nut 64 and can move together with the ball nut 64 in the first direction (A1). The movable bracket 71 according to the first embodiment of the present disclosure can include a fixed bracket 72 fixed to the wing 66 of the ball nut 64, and having a shape surrounding the outer face of the ball nut body 65, and an extended bracket 73 which extends from the fixed bracket 72 and faces toward the guiding member 43.

The movable block 75 can be modified in a variety of ways as long as the block 75 hangs on an outer face of the guide rail 45 and performs a sliding movement along the guide rail 45. The movable block 75 according to the first embodiment of the present disclosure is connected to the extended bracket 73 of the movable bracket 71.

Two guide rails 45 form a pair and are arranged side by side and extend in the first direction (A1). Two movable blocks 75 form a pair and has a shape that hangs on an outer face of the guide rail 45. Therefore, the movement of the movable block 75 can be performed more stably, and the movement of the movable bracket 71 fixed to the movable block 75 can also be performed stably in the first direction (A1).

Figure 8:
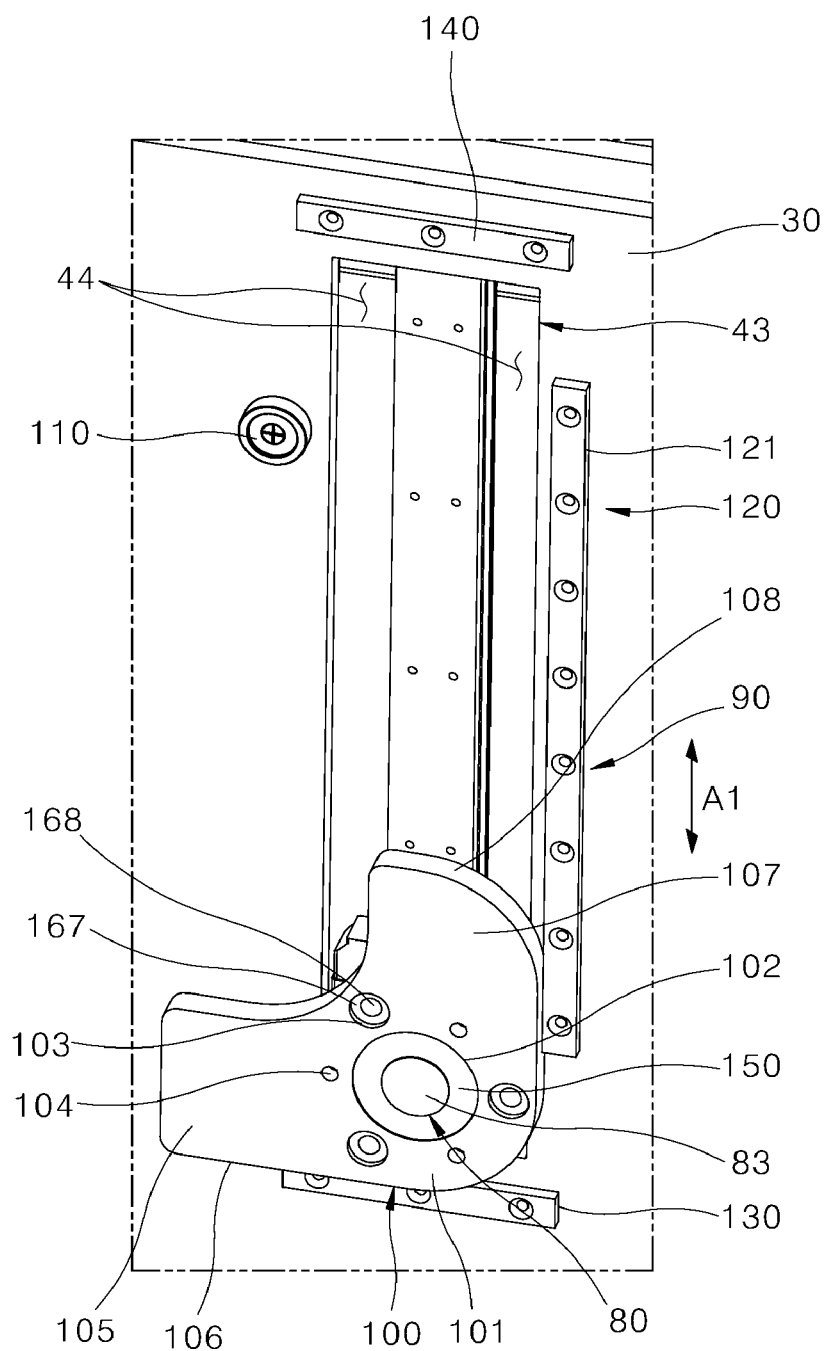
FIG. 8 is a perspective view showing a rotation guiding mechanism according to the first embodiment of the present disclosure.
Figure 9:
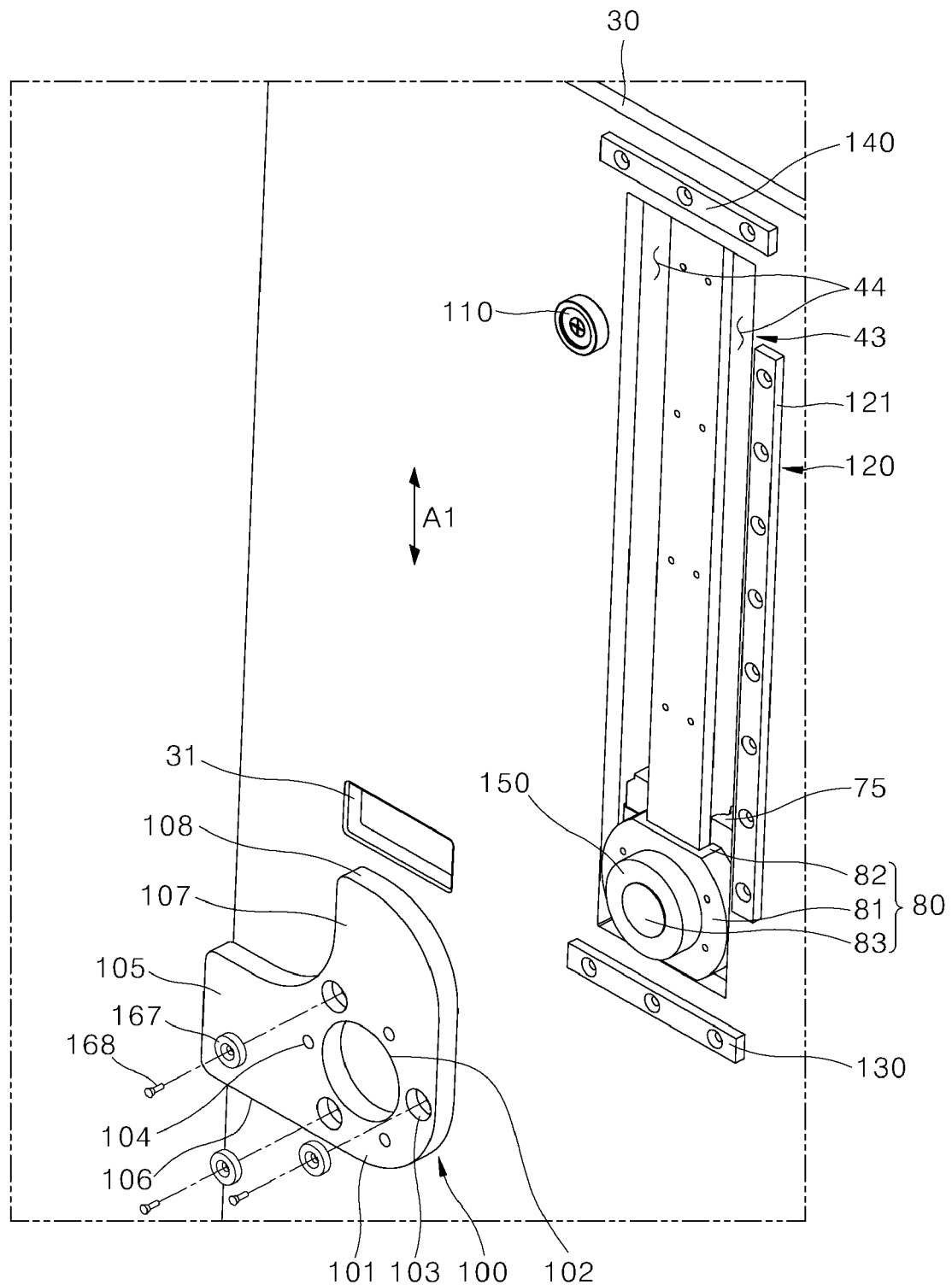
FIG. 9 is a perspective view showing a state where a rotatable cam structure is separated from a second movable body according to the first embodiment of the present disclosure.
Figure 10:
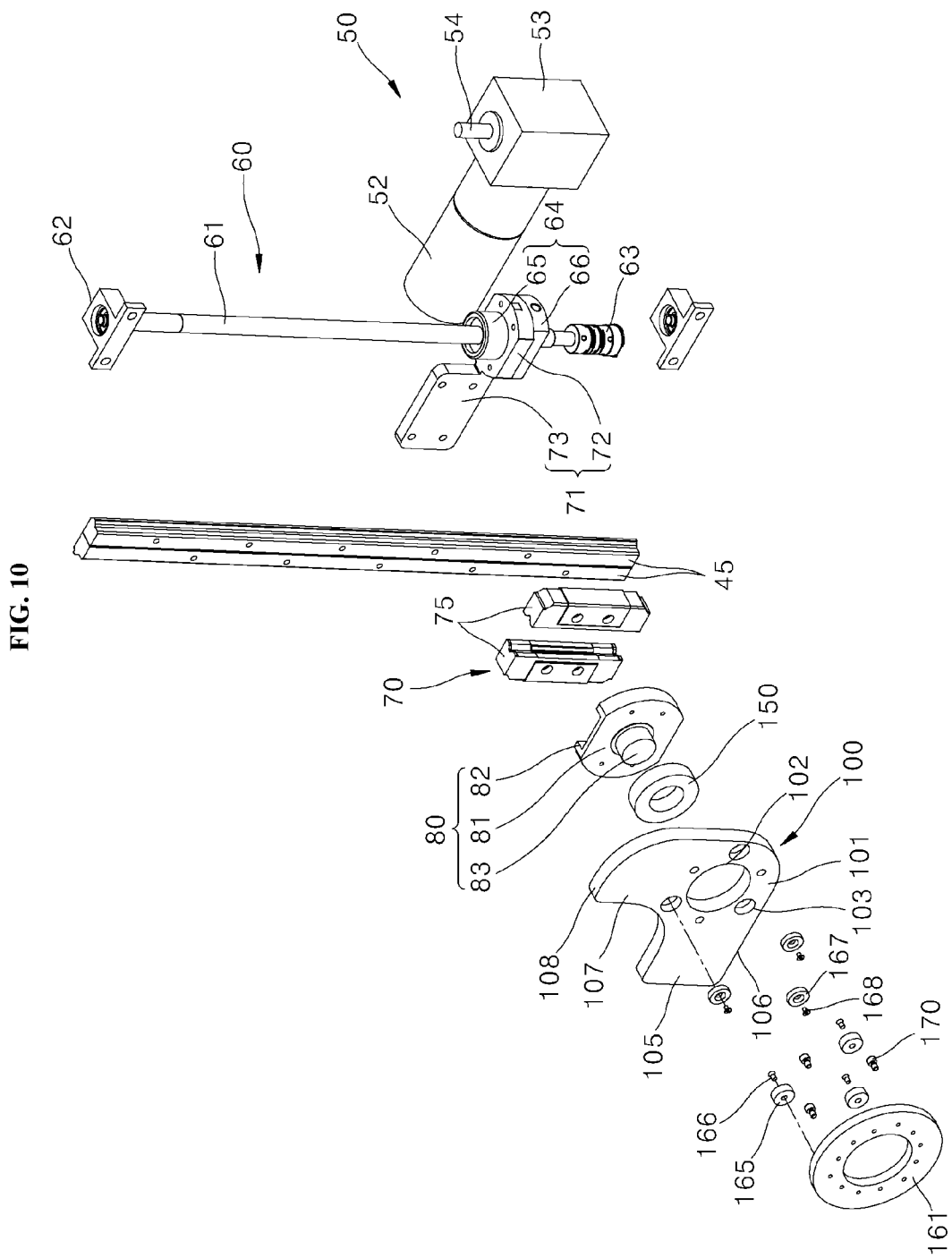
FIG. 10 and FIG. 11 are exploded perspective views of the linearly-movable assembly, the rotatable cam structure, and a panel connector according to the first embodiment of the present disclosure.
Figure 11:
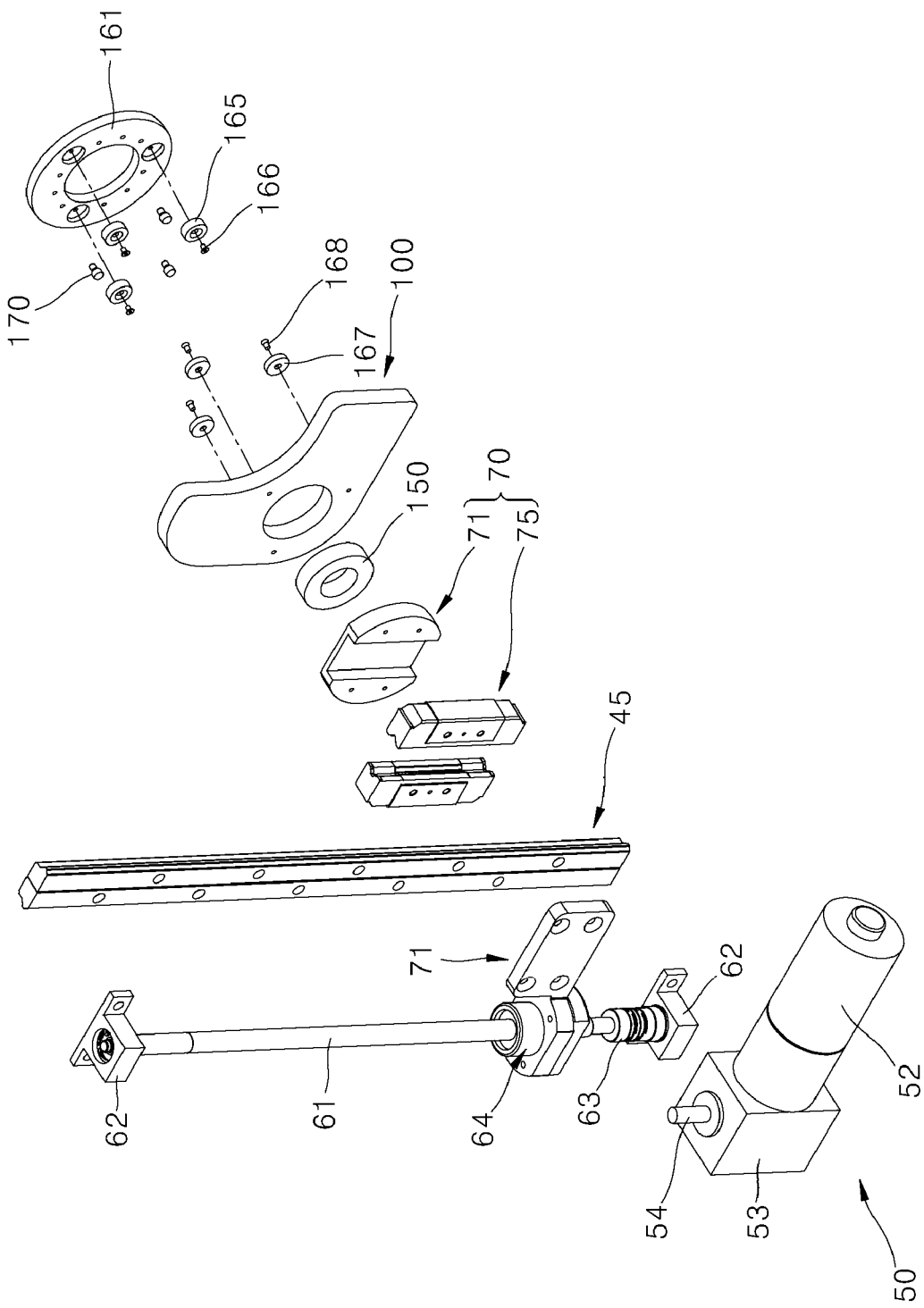

FIG. 8 is a perspective view showing the rotation guiding mechanism 90 according to the first embodiment of the present disclosure. FIG. 9 is a perspective view showing a state in which a rotatable cam structure 100 is separated from the second movable body 80 according to the first embodiment of the present disclosure. FIGS. 10 and 11 are exploded perspective views of the linearly-movable assembly 60, the rotatable cam structure 100, and a panel connector 160 according to the first embodiment of the present disclosure.

As shown in FIGS. 8 to 11, the second movable body 80 can be modified in a number of ways as long as one side of the second movable body 80 is connected to the first movable body 70 via the guide hole 44, while the opposite side of the second movable body 80 is connected to the rotation guiding mechanism 90. The second movable body 80 is located on a front face of the first support body 30, and the first movable body 70 which is connected to the second movable body 80 is located on the rear face of the first support body 30. The first movable body 70 and the second movable body 80 are connected to each other via the guide hole 44, and move in the vertical direction and along the guide rail 45.

The second movable body 80 according to the first embodiment of the present disclosure can include a slidable body 81, a side member 82, and a rotation support shaft 83.

The slidable body 81 is installed to face toward the first movable body 70 while the first support body 30 is interposed therebetween. The slidable body 81 is located in front of the first support body 30.

The side member 82 has a protrusion shape extending from both opposing sides of the slidable body 81 in a direction toward the first movable body 70. Since the side member 82 is fixed to the movable block 75 of the first movable body 70 via bolting, etc. while being in contact with the movable block 75 of the first movable body 70, the side member can move, in the first direction (A1), together with the movable block 75.

The rotation support shaft 83 protrudes from the slidable body 81 toward the display module 10. The rotation support shaft 83 according to the first embodiment of the present disclosure has a cylindrical shape protruding from the slidable body 81 in the horizontal direction.

The second movable body 80 is located on a front face of the first support body 30, and the first movable body 70 is located on a rear face of the first support body 30. Therefore, the first movable body 70 and the second movable body 80 surrounds the guide rail 45, so that the rotatable cam structure 100 connected to the second movable body 80 can move stably.

Rotation Guiding Mechanism

Figure 12:
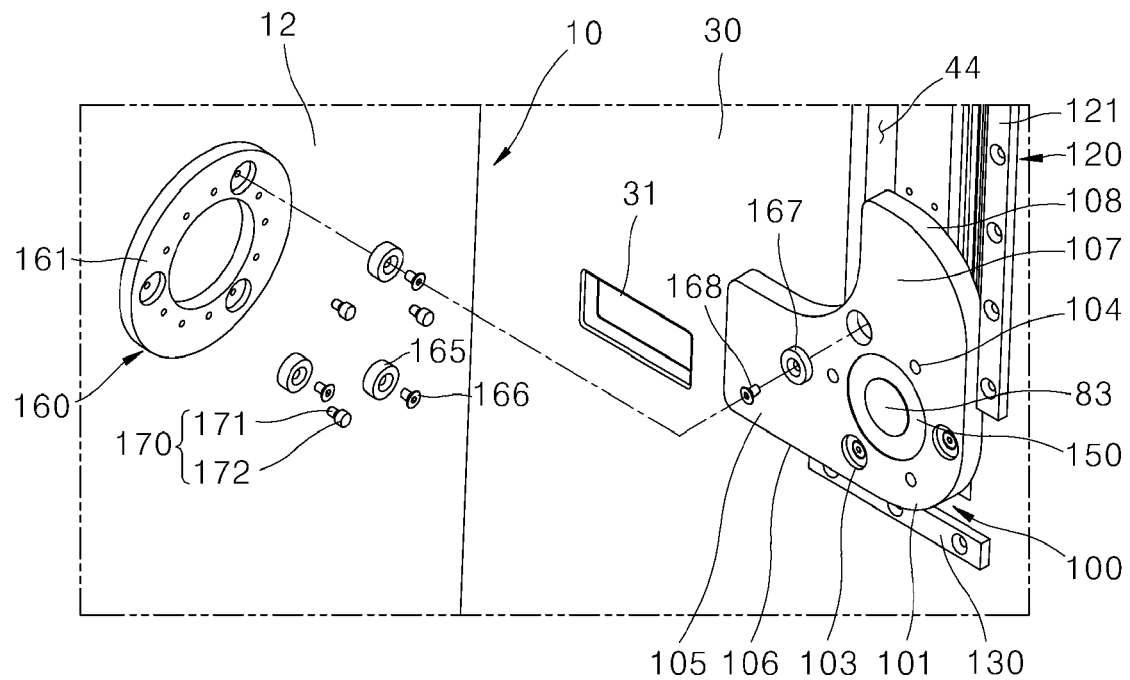
FIG. 12 is an exploded perspective view of a panel connector according to the first embodiment of the present disclosure.
Figure 13:
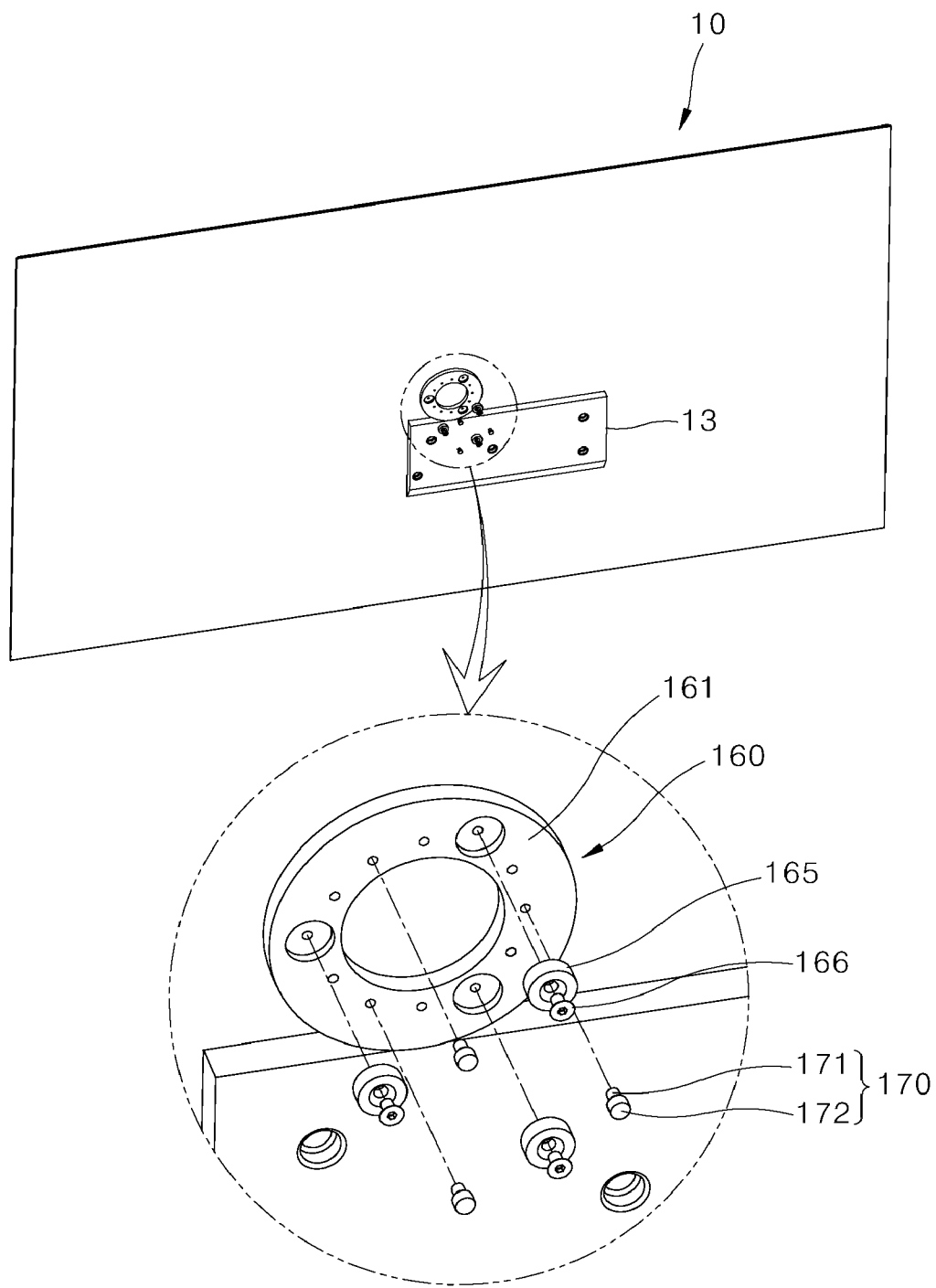
FIG. 13 is a perspective view showing a state in which the panel connector is installed on a rear face of a display module according to the first embodiment of the present disclosure.

FIG. 12 is an exploded perspective view of the panel connector 160 according to the first embodiment of the present disclosure. FIG. 13 is a perspective view showing a state in which the panel connector 160 is installed on the rear face of the display module 10 according to the first embodiment of the present disclosure.

As shown in FIG. 12 and FIG. 13, the rotation guiding mechanism 90 can be modified in various ways as long as the rotation guiding mechanism 90 connects the linearly-movable assembly 60 to the display module 10, and guides the rotation of the display module 10 resulting from the motion of the linearly-movable assembly 60.

The display module 10 can move in a linear direction using the linearly-movable assembly 60, and can rotate using a cam structure of the rotation guiding mechanism 90. The cam structure refers to a shape of a cam that induces rotational motion. The rotatable cam structure 100 of the rotation guiding mechanism 90 has a shape of a plate, and the display module 10 rotates using the cam structure of the rotatable cam structure 100.

The cam can be broadly classified into a planar cam in which an outline or a groove is defined by a planar curve, and a three-dimensional cam in which an outline or a groove is defined by a spatial curve. A protrusion can protrude from an outer face of the cam. This protrusion rotates while being in contact with a fixed rotation-inducing protrusion 110, such that a rotational motion of the display module 10 can be induced.

The cam structure of the rotation guiding mechanism 90 having a plate shape and the protrusion protruding outwardly is caught on a fixed member. Thus, the display module 10 rotates in a frontwards or reverse direction such that a viewing mode thereof is switched to between the first mode and the second mode.

The rotation guiding mechanism 90 according to the first embodiment of the present disclosure includes at least one of the rotatable cam structure 100, the rotation-inducing protrusion 110, a guiding assembly 120, a ring bearing 150, and the panel connector 160.

The rotatable cam structure 100 can be modified in various ways as long as the cam 100 is rotatably installed on the second movable body 80 and includes multiple protrusions. In accordance with the present disclosure, the rotatable cam structure 100 has a cam structure in order to implement both of the upward movement and the rotation movement using a single driver 50.

The rotatable cam structure 100 according to the first embodiment of the present disclosure can include a cam body 101, a first cam protrusion 105, and a second cam protrusion 107.

The cam body 101 can be modified in various ways as long as a cam hole 102 is defined in a center position thereof and is rotatably installed on the second movable body 80. The cam body 101 according to the first embodiment of the present disclosure is plate-shaped, and the rotation support shaft 83 of the second movable body 80 is inserted into the cam hole 102 of the cam body 101. The cam body 101 is located in front of the first support body 30 and extends along and on the first support body 30.

The cam body 101 has a first receiving hole 103 for receiving a second fixed member 167 and a second receiving hole 104 for fixedly receiving a fixed connector member 170. The first receiving hole 103 is positioned outside the cam hole 102 and includes a plurality of holes arranged along a circumferential direction. The second receiving hole 104 is located outside the cam hole 102, and includes a plurality of holes arranged along the circumferential direction and along with the first receiving holes 103.

In one example, the ring bearing 150 can be additionally installed on an outer face of the rotation support shaft 83. The ring bearing 150 is formed in a ring shape. Bearings are arranged along the circumferential direction of the inner face thereof. Therefore, when the cam body 101 located on an outer face of the rotation support shaft 83 whose rotation is restricted rotates, the friction can be reduced such that the cam body 101 can be easily rotated.

The first cam protrusion 105 protrudes outwardly from the cam body 101. Moreover, the second cam protrusion 107 can have a protruding direction intersecting a protruding direction of the first cam protrusion 105 and can protrude outwardly from the cam body 101. The first cam protrusion 105 and the second cam protrusion 107 extend or protrude, in different directions, from the cam body 101. The extension directions of the first cam protrusion 105 and the second cam protrusion 107 can intersect each other at a right angle. When necessary, the extension directions of the first cam protrusion 105 and the second cam protrusion 107 can intersect each other at an acute angle range. However, based on a rotation angle of the rotatable cam structure 100, various modifications are possible. In one example, the extension directions of the first cam protrusion 105 and the second cam protrusion 107 can intersect each other at an obtuse angle.

When the rotatable cam structure 100 can move up and down, that is, in the first direction (A1), the first cam protrusion 105 or the second cam protrusion 107 can be caught on the rotation-inducing protrusion 110 such that the protrusion can rotate. When the first cam protrusion 105 or the second cam protrusion 107 rotates, the rotatable cam structure 100 can rotate.

A side face of the first cam protrusion 105 is linear and is connected to the cam body 101. This linear face of the first cam protrusion 105 is referred to as a first cam side face 106. A side face between the first cam protrusion 105 and the second cam protrusion 107 is curved. A side face of the second cam protrusion 107 is curved and is referred to as a second cam side face 108.

Moreover, the first mode refers to a landscape viewing mode in which the horizontal dimension of the display module 10 is larger than the vertical dimension of the display module 10. Moreover, the second mode refers to a portrait viewing mode in which the horizontal dimension of the display module 10 is smaller than the vertical dimension of the display module 10.

When the rotatable cam structure 100 is positioned at a bottom level of the vertically elongate guide hole 44, and the first cam protrusion 105 is oriented in a horizontal direction as the second direction (A2), a viewing mode can be defined as the first mode. Moreover, when the rotatable cam structure 100 is located at a top level of the guide hole 44, and the first cam protrusion 105 is oriented in the vertical direction as the first direction (A1), a viewing mode can be defined as the second mode.

The rotatable cam structure 100 has a plate shape with a preset thickness, and is rotatably installed on the rotation support shaft 83. Moreover, the cam 100 moves in the first direction (A1), and thus a position and an orientation of each of the first cam protrusion 105 and the second cam protrusion 107 can vary due to the rotation-inducing protrusion 110 and the guiding assembly 120.

The rotation-inducing protrusion 110 can be modified in a variety of ways as long as it is located in a movement path of the rotatable cam structure 100, and contacts the rotatable cam structure 100 to induce the rotation of the rotatable cam structure 100. The rotation-inducing protrusion 110 according to the first embodiment of the present disclosure has a cylindrical shape protruding frontwards from the first support body 30. Moreover, a roller can be additionally installed on an outer face of the rotation-inducing protrusion 110 to reduce friction caused via contact with the rotatable cam structure 100. Moreover, an elastic member such as rubber or urethane can be additionally installed on the outer face of the rotation-inducing protrusion 110 to reduce the impact and noise generated when contacting the rotatable cam structure 100.

The guiding assembly 120 can be modified in various ways as long as it is fixed to the first support body 30 and induces the rotation of the rotatable cam structure 100 such that the viewing mode changes to the first mode or the second mode. Moreover, the guiding assembly 120 extends along the movement path of the rotatable cam structure 100 and contacts the side face of the rotatable cam structure 100, and guides the rotation and the movement of the rotatable cam structure 100. The guiding assembly 120 according to the first embodiment of the present disclosure can include a first guiding protrusion 121, a second guiding protrusion 130, and a third guiding protrusion 140.

The first guiding protrusion 121 can be modified in various ways as long as it is in contact with the rotatable cam structure 100 and guides the movement of the rotatable cam structure 100 in the first direction (A1). The first guiding protrusion 121 according to the first embodiment of the present disclosure is installed to be opposite to the rotation-inducing protrusion 110 while the rotatable cam structure 100 is interposed therebetween. Moreover, the first guiding protrusion 121 extends in the first direction (A1). Moreover, the first guiding protrusion 121 has a rod-shape protruding frontwards from the first support body 30 and is fixed to the first support body 30. While the first guiding protrusion 121 is in contact with the rear face of the rotatable cam structure 100, the first guiding protrusion 121 guides the vertical movement of the rotatable cam structure 100.

The second guiding protrusion 130 can be modified in a variety of ways as long as it guides the rotatable cam structure 100 to rotate such that the viewing mode is brought into the first mode. The second guiding protrusion 130 according to the first embodiment of the present disclosure is positioned at a bottom level of the first guiding protrusion 121 and extends in a direction intersecting with the extension direction of the first guiding protrusion 121. Moreover, the second guiding protrusion 130 has a rod-shape protruding frontwards from the first support body 30 and is fixed to the first support body 30. The second guiding protrusion 130 is positioned at a bottom level of the vertically elongate guide hole 44 and extends in the horizontal direction.

Therefore, the rotatable cam structure 100 which moves downwards along the first direction (A1) is in contact with the second guiding protrusion 130 such that the downward movement thereof is limited. Moreover, when the first cam protrusion 105 is oriented not in the horizontal direction, that is, the second direction (A2), but in an upward inclination, the rotatable cam structure 100 is contact with the second guiding protrusion 130 and thus rotates, so that the first cam protrusion 105 is oriented in the second direction (A2).

The third guiding protrusion 140 can be modified in a number of ways as long as it guides the rotatable cam structure 100 to rotate such that the viewing mode is brought into in the second mode. The third guiding protrusion 140 according to the first embodiment of the present disclosure is located at a top level of the first guiding protrusion 121 and extends in a direction intersecting with the extension direction of the first guiding protrusion 121. Moreover, the third guiding protrusion 140 has a rod-shape protruding frontwards from the first support body 30 and is fixed to the first support body 30. The third guiding protrusion 140 is located at a top level of the guide hole 44, and extends in the horizontal direction.

Therefore, the rotatable cam structure 100 which moves upward along the first direction (A1) is in contact with the third guiding protrusion 140 such that the upward movement thereof is limited. Moreover, when the second cam protrusion 107 is not oriented in the second direction (A2) as the horizontal direction, but in an upward inclination, the second cam protrusion 107 is in contact with the third guiding protrusion 140 and thus rotate, such that the second cam protrusion 107 is oriented in the second direction (A2).

Moreover, the second guiding protrusion 130 and the third guiding protrusion 140 extend in a parallel manner to each other while being opposite to each other, and can extend in the second direction (A2) intersecting with the first direction (A1). Moreover, the rotation-inducing protrusion 110 is located between the second guiding protrusion 130 and the third guiding protrusion 140. When a distance between the rotation-inducing protrusion 110 and the second guiding protrusion 130 is defined as a first distance, and a distance between the rotation-inducing protrusion 110 and the third guiding protrusion 140 is defined as a second distance, the first distance can be larger than the second distance.

Therefore, the rotatable cam structure 100 which has rotated first by the rotation-inducing protrusion 110 comes into contact with the third guiding protrusion 140 and thus second rotates. Thus, the rotation of the rotatable cam structure 100 can be stably performed.

The panel connector 160 can be modified in a variety of ways as long as it connects the rotatable cam structure 100 and display module 10 to each other and allows the rotations of the rotatable cam structure 100 and the display module 10 to be synchronized. The panel connector 160 according to the first embodiment of the present disclosure can include at least one of a swing bracket 161, the first fixed member 165, the second fixed member 167, and the fixed connector member 170.

The swing bracket 161 can be modified in a variety of ways as long as it is fixed to a face of the display module 10 facing toward the rotatable cam structure 100. The swing bracket 161 according to the first embodiment of the present disclosure is fixed to the rear face of the display module 10. The swing bracket 161 has a plate shape and is fixed to the rear face of the support panel 12. The swing bracket 161 can be formed integrally with the support panel 12. When necessary, the swing bracket 161 can be manufactured separately from the support panel 12 and then can be fixed to the support panel 12. Moreover, the swing bracket 161 has a plurality of grooves for fixedly receiving the first fixed member 165 and the fixed connector member 170.

The first fixed member 165 can be fixed to the swing bracket 161. The first fixed member 165 can exhibit a magnetic force, or can be made of a material that adheres to the magnet when necessary. While the first fixed member 165 is inserted into the groove defined in the swing bracket 161, a first movement-limiting member 166 passes through the first fixed member 165 and is fixed to the swing bracket 161. Therefore, the first fixed member 165 can be maintained in a fixed state to the swing bracket 161.

The second fixed member 167 is fixed to a face of the rotatable cam structure 100 facing toward the first fixed member 165. The second fixed member 167 can exhibit a magnetic force, and can be made of a material that adheres to the magnet when necessary. While the second fixed member 167 is inserted into the first receiving hole 103 of the rotatable cam structure 100, a second movement-limiting member 168 passes through the second fixed member 167 and is fixed to the rotatable cam structure 100. Therefore, the second fixed member 167 can be maintained in a fixed state to the rotatable cam structure 100.

At least one of the first fixed member 165 or the second fixed member 167 can exhibit a magnetic force. Moreover, the first fixed member 165 and the second fixed member 167 can be fixed to the cam using the magnetic force. The first fixed member 165 and the second fixed member 167 according to the first embodiment of the present disclosure can be made of a permanent magnet.

The fixed connector member 170 can be modified in various ways as long as one side of the fixed connector member 170 is inserted into the swing bracket 161, and the opposite side of the fixed connector member 170 is inserted into the rotatable cam structure 100. The fixed connector member 170 according to the first embodiment of the present disclosure includes an inserted protrusion 171 fixed to the swing bracket 161, and a head member 172 extending from the inserted protrusion 171 and having a diameter larger than that of the inserted protrusion 171.

The inserted protrusion 171 can be fastened to the swing bracket 161 or fixed thereto in a fitting manner. The head member 172 can be fastened to the second receiving hole 104 of the rotatable cam structure 100 or fixed thereto in a fitting manner.

Figure 25:
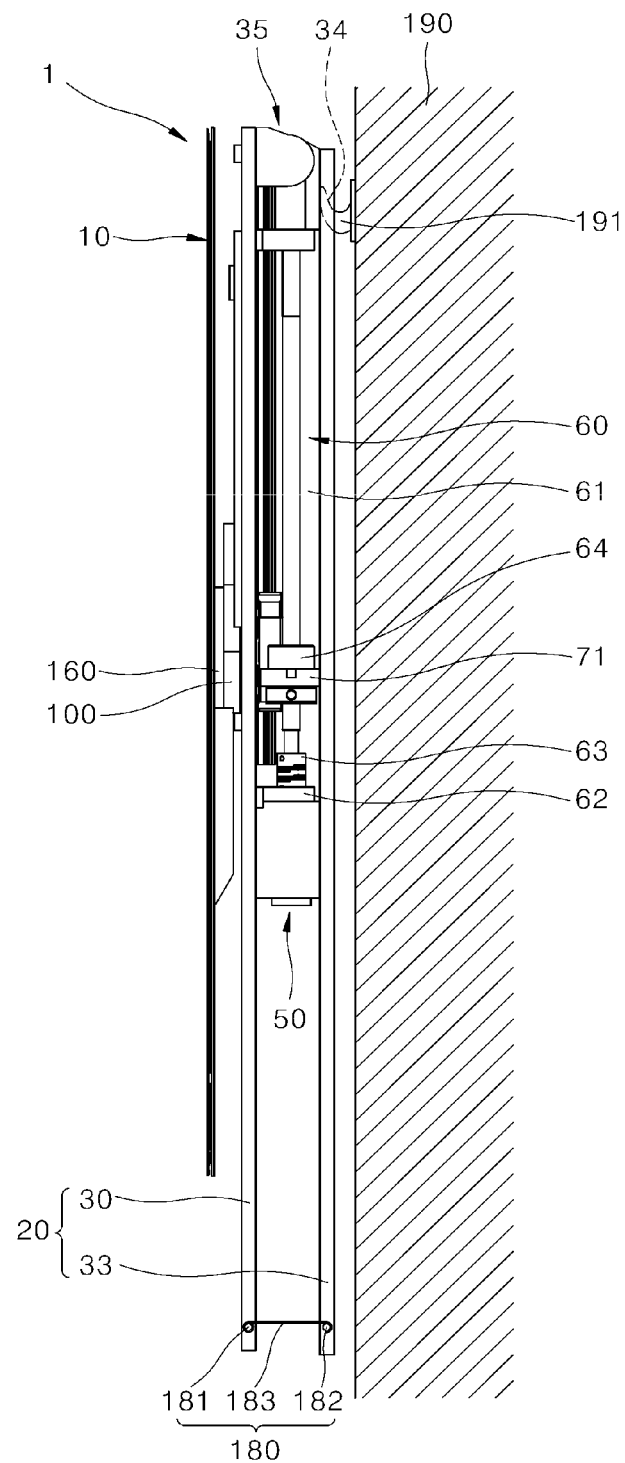
FIG. 25 is a side view showing a state in which a display apparatus is used in a wall-mounted mode according to the first embodiment of the present disclosure.

FIG. 25 is a side view showing a state in which the display apparatus 1 according to the first embodiment of the present disclosure is used in the wall-mounted mode.

As shown in FIG. 25, the first support body 30 and the second support body 33 extend in a parallel manner with each other while facing away each other. Moreover, since a hook ring 191 disposed on a support wall 190 is caught on the hook receiving groove 34 defined in the second support body 33, the display apparatus 1 is fixed to the support wall 190.

In one example, a rotation stopper 180 can be additionally installed at a bottom level of the support assembly 20. The rotation stopper 180 can include a first pivoting-support protrusion 181 protruding from a side face of the first support body 30, a second pivoting-support protrusion 182 protruding from a side face of the second support body 33, and a stopper member 183 pivotally coupled to the first pivoting-support protrusion 181 and pivoting around the first pivoting-support protrusion 181 so as to be caught on the second pivoting-support protrusion 182 to stop the movement of the movable component.

While the first support body 30 and the second support body 33 face away each other, the stopper member 183 pivots around the first pivoting-support protrusion 181 and then is caught on the second pivoting-support protrusion 182, such that the movement of the first support body 30 and the second support body 33 can be restrained.

The terms 'first direction' and 'second direction' used in the present disclosure and claims indicate a specific direction. That is, in the embodiment shown in FIG. 1, the first direction (A1) represents the up and down direction or the vertical direction of the display module 10, and the second direction (A2) represents the left and right direction or the horizontal direction of the display module 10.

Operation of First Embodiment

Hereinafter, an operation of the display apparatus 1 according to the first embodiment of the present disclosure will be described in detail with reference to the accompanying drawings.

Figure 14:
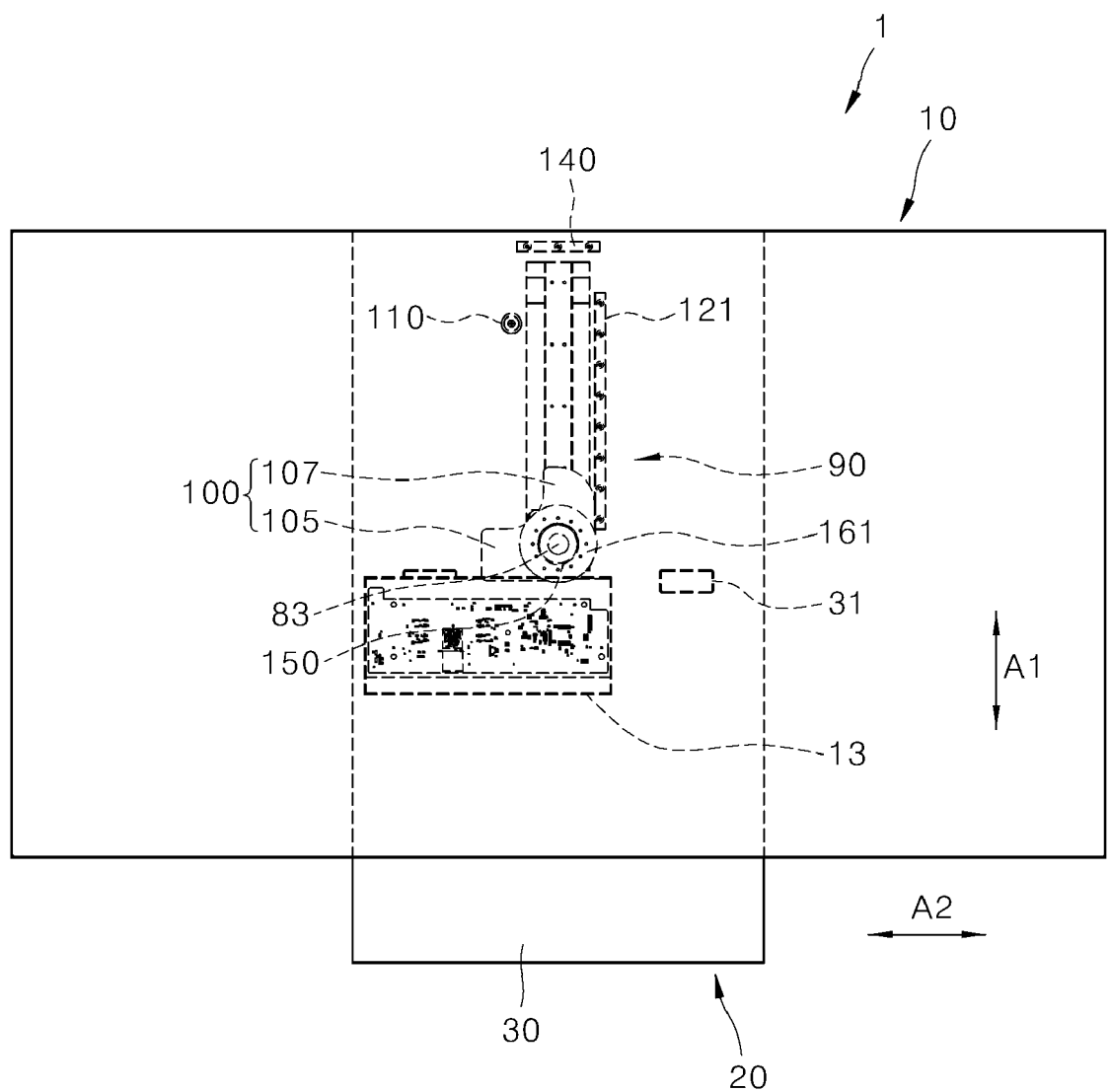
FIG. 14 is a front view showing a state in which the display module is brought into a landscape viewing mode according to the first embodiment of the present disclosure.
Figure 15:
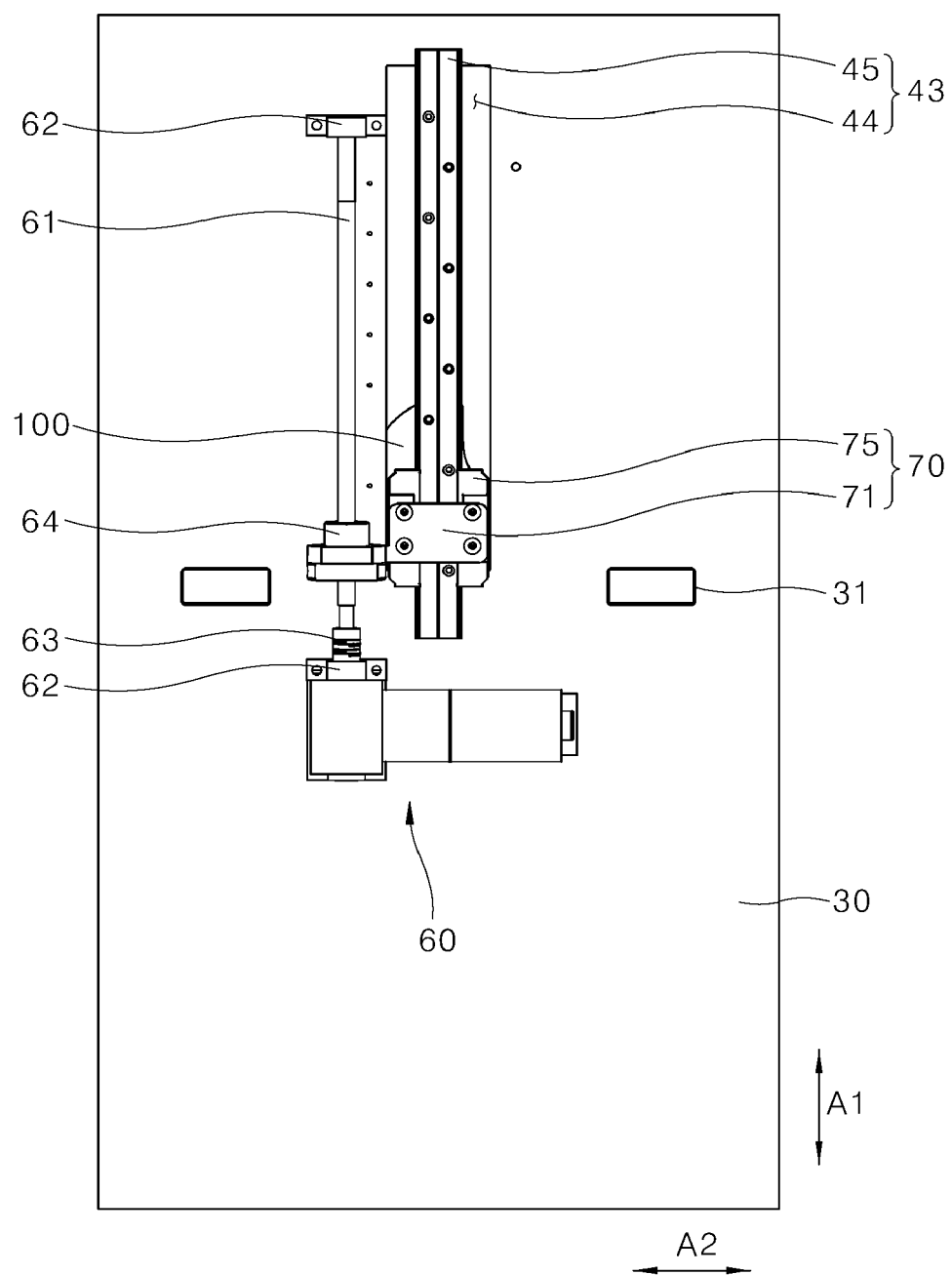
FIG. 15 is a rear view showing a rear face of a first support body according to the first embodiment of the present disclosure.
Figure 16:
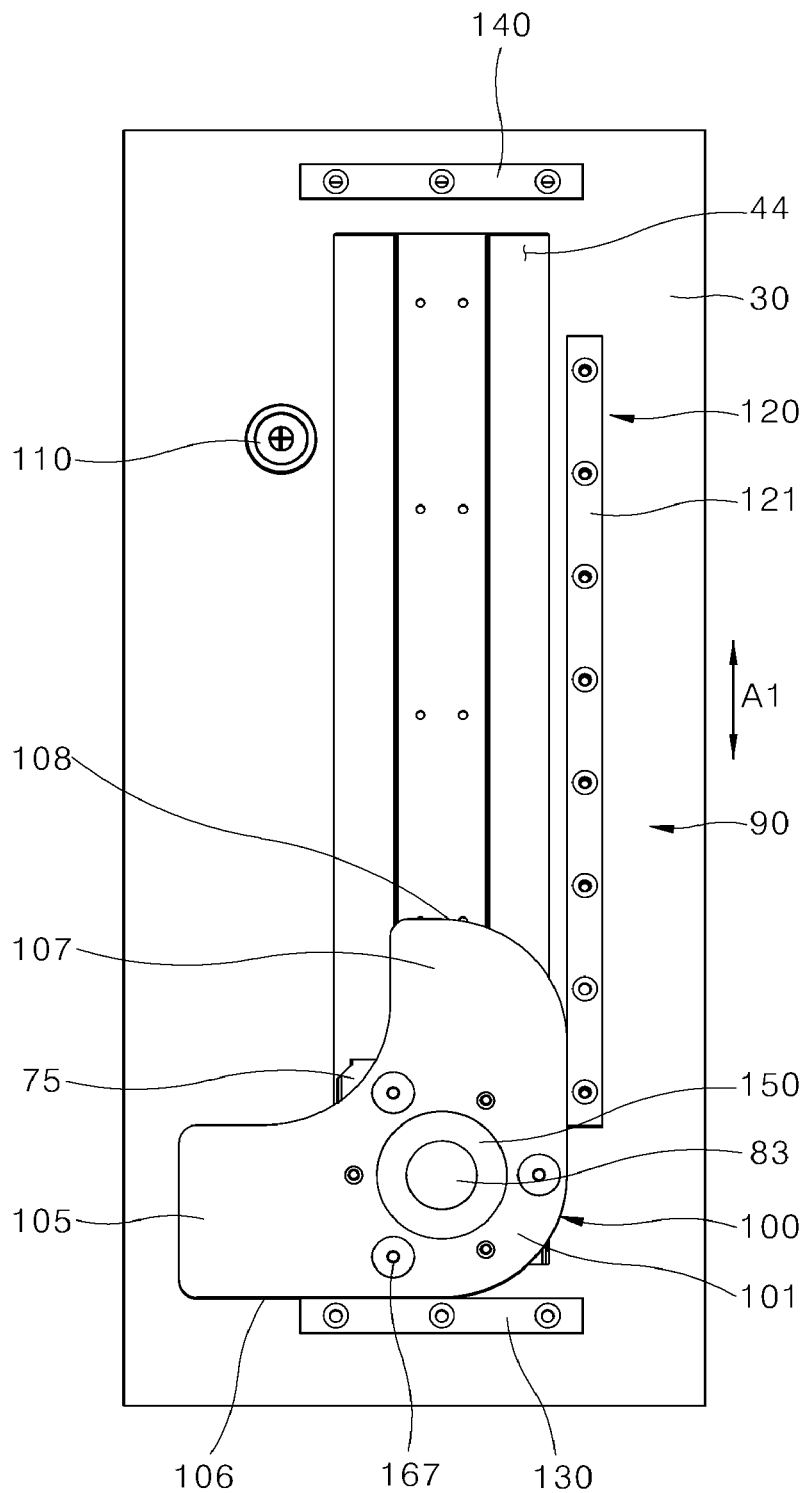
FIG. 16 is a diagram showing a state in which the rotatable cam structure is in contact with a second guiding protrusion such that the display module is brought into a landscape viewing mode according to the first embodiment of the present disclosure.

FIG. 14 is a front view showing a state in which the display module 10 is brought into a landscape viewing mode according to the first embodiment of the present disclosure. FIG. 15 is a rear view showing a rear face of the first support body 30 according to the first embodiment of the present disclosure. FIG. 16 is a diagram showing a state in which the rotatable cam structure 100 contacts the second guiding protrusion 130 and is brought into a landscape viewing mode according to the first embodiment of the present disclosure.

As shown in FIGS. 14 to 16, when the display module 10 is in the landscape viewing mode, the rotatable cam structure 100 is positioned at a bottom level of the vertically elongate guide hole 44. Moreover, a bottom of the rotatable cam structure 100 is in contact with the second guiding protrusion 130.

The first cam protrusion 105 of the rotatable cam structure 100 is oriented in the horizontal direction as the second direction (A2), and the second cam protrusion 107 is oriented in the upward direction.

When a user intends to watch the display module 10 in the portrait viewing mode, the driver 50 operates under a control signal. When the driver 50 is activated and the screw bar 61 rotates, the ball nut 64 moves along the screw bar 61 in the first direction (A1). Together with the ball nut 64, the movable bracket 71 can move in the first direction (A1), and thus the movable block 75 can move. The second movable body 80 connected to the movable block 75 can move in the first direction (A1), and the rotatable cam structure 100 which is rotatably installed on a front face of the second movable body 80 can move in the first direction (A1).

Figure 17:
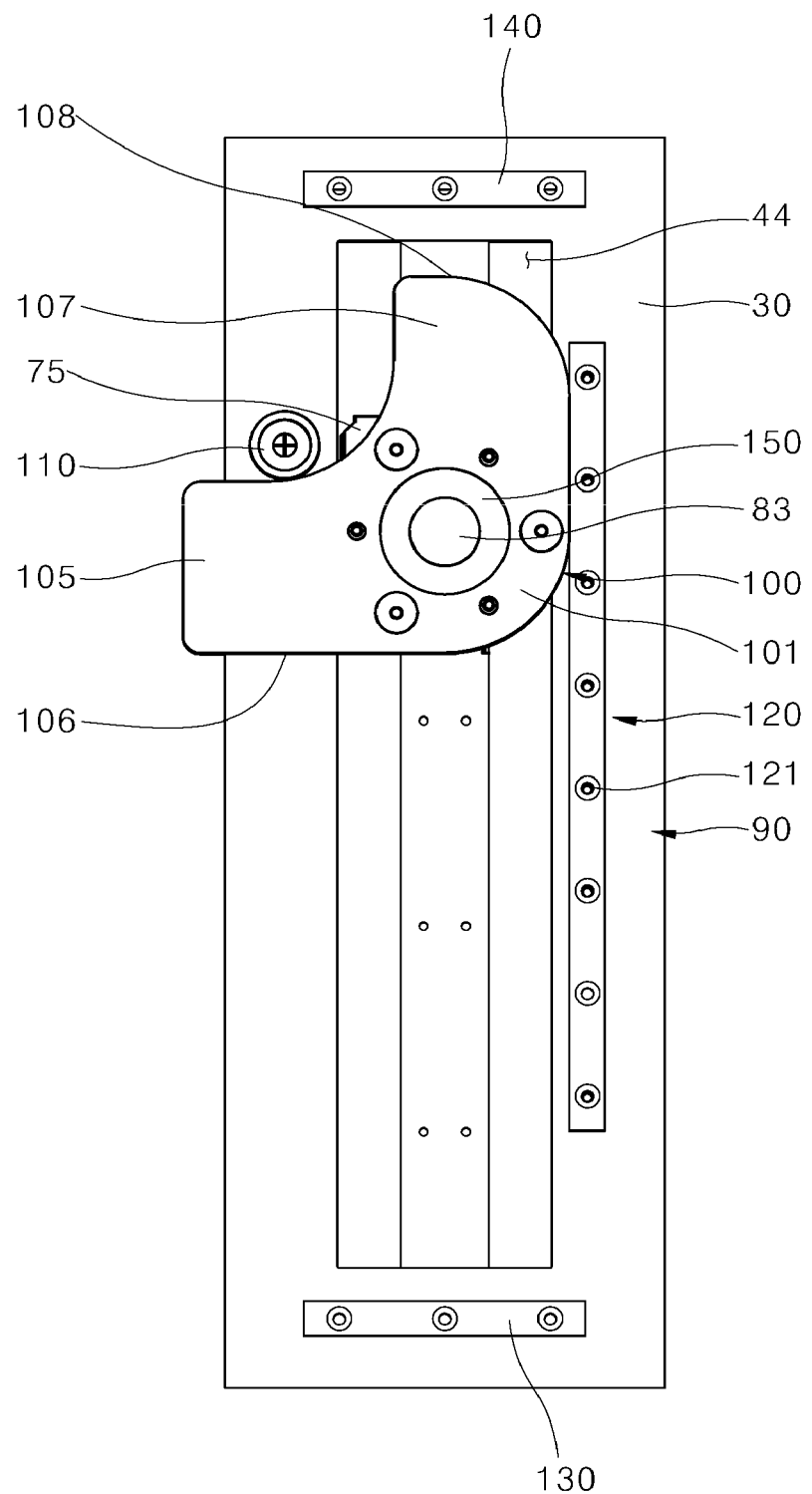
FIG. 17 is a diagram showing a state in which the rotatable cam structure moves upward and is in contact with a rotation-inducing protrusion according to the first embodiment of the present disclosure.
Figure 18:
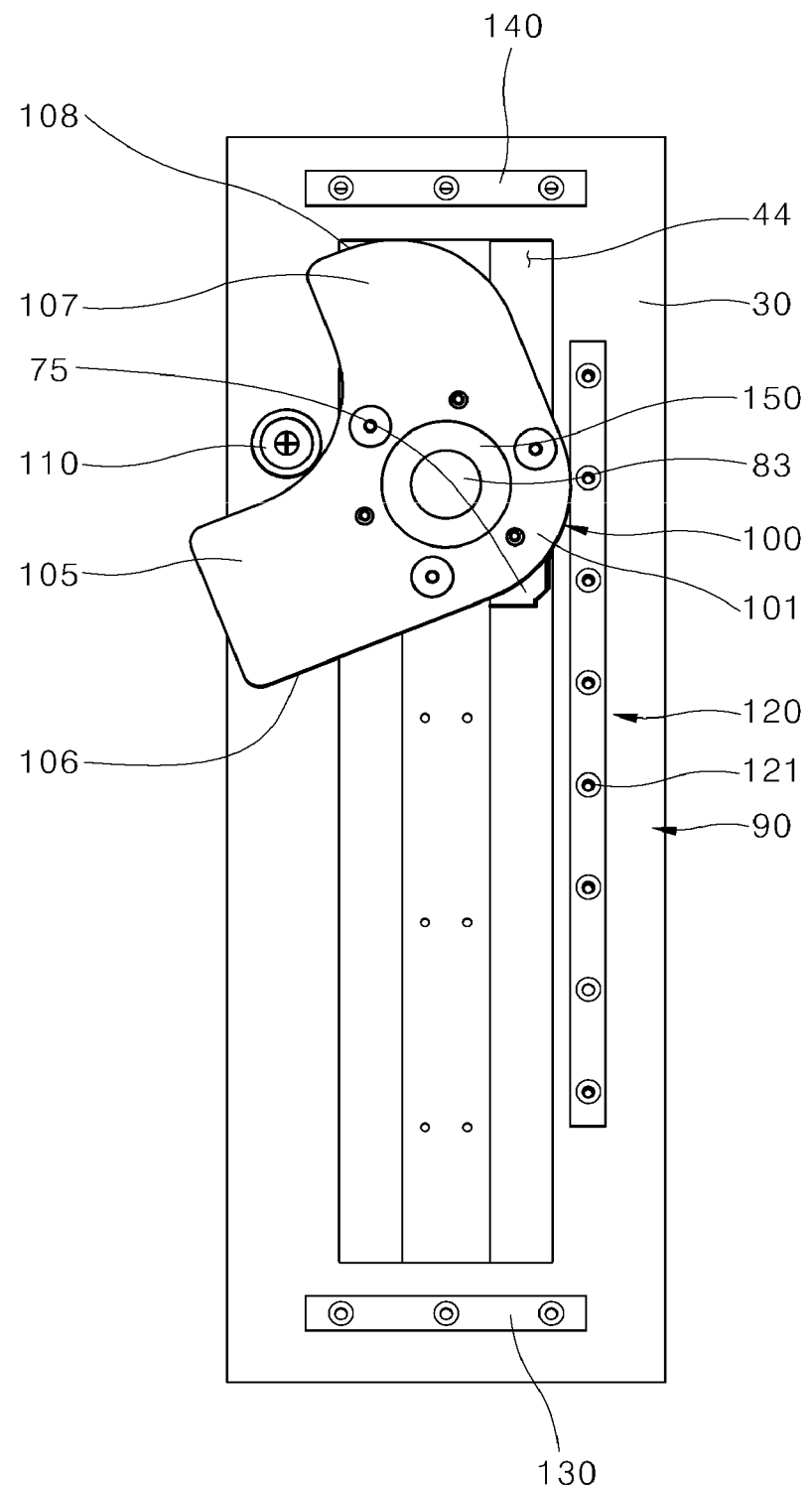
FIG. 18 is a diagram showing a state in which the rotatable cam structure is caught on and rotated by the rotation-inducing protrusion when the rotatable cam structure moves upwards according to the first embodiment.

FIG. 17 is a diagram showing a state in which the rotatable cam structure 100 moves upwards and thus is in contact with the rotation-inducing protrusion 110 according to the first embodiment of the present disclosure. FIG. 18 is a diagram showing a state in which the rotatable cam structure 100 is caught on the rotation-inducing protrusion 110 and thus rotates when the rotatable cam structure 100 moves upwards according to the first embodiment.

As shown in FIG. 17 and FIG. 18, when the rotatable cam structure 100 moving upward is caught on the rotation-inducing protrusion 110, the rotatable cam structure 100 rotates. When the top of the first cam protrusion 105 of the rotatable cam structure 100 is caught on the rotation-inducing protrusion 110, the rotatable cam structure 100 starts to rotate around the rotation support shaft 83 in a counterclockwise direction (FIG. 17).

Figure 19:
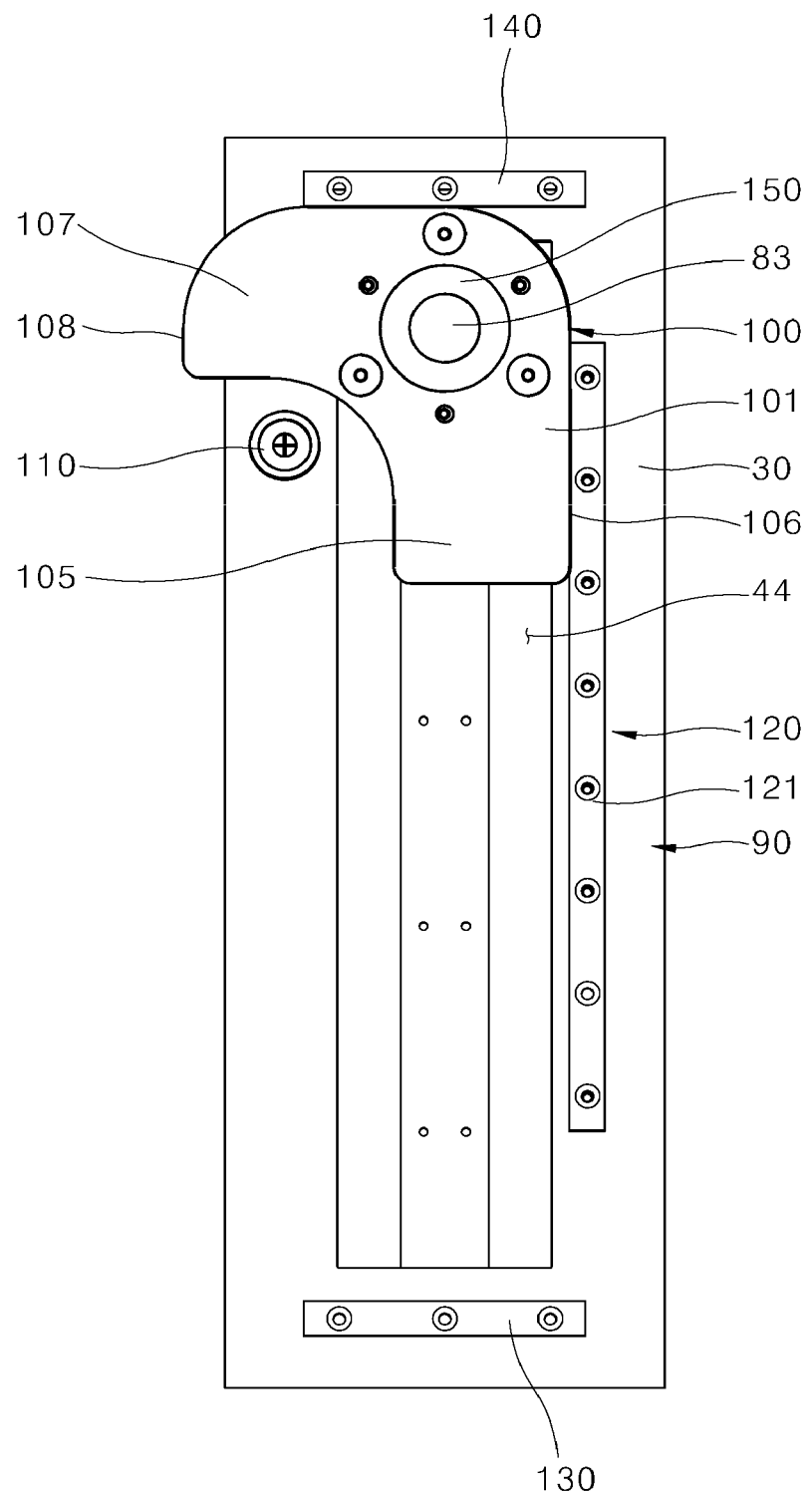
FIG. 19 is a diagram showing a state in which the rotatable cam structure is in contact with a third guiding protrusion such that the display module is brought into a portrait viewing mode according to the first embodiment of the present disclosure.
Figure 20:
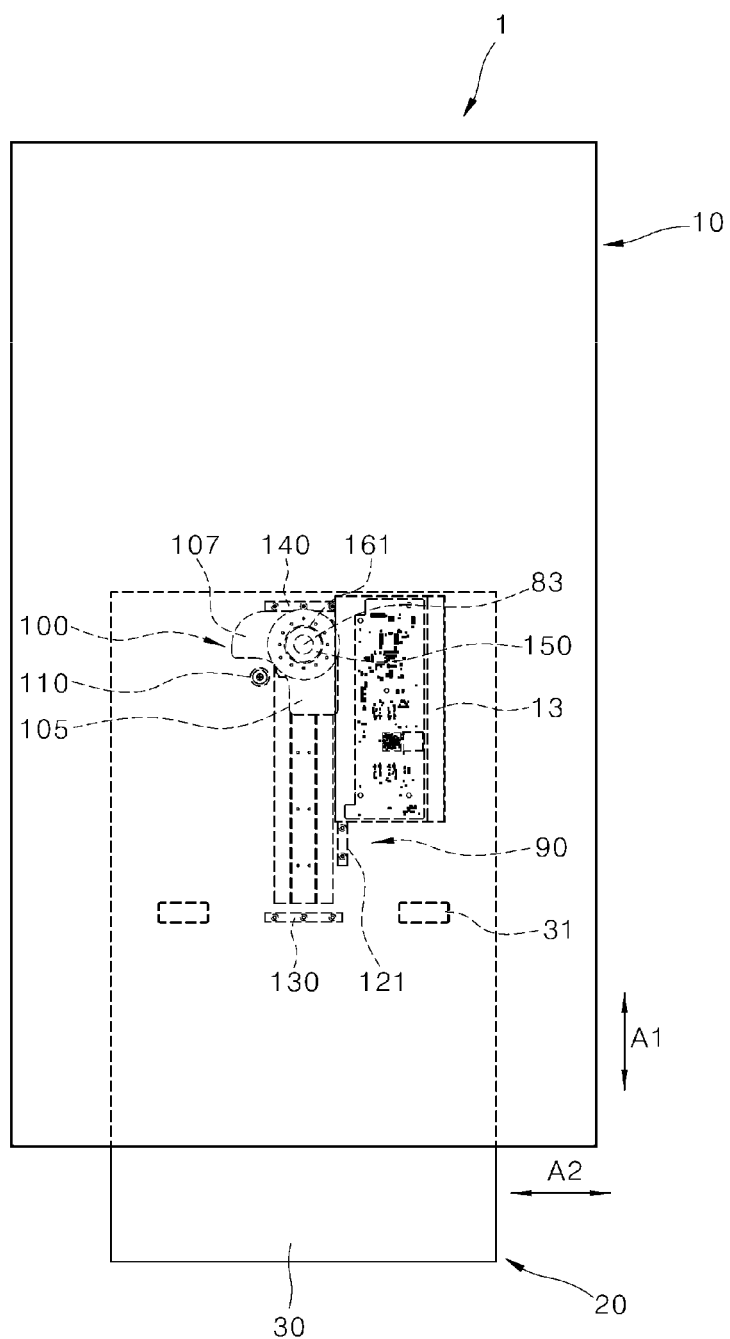
FIG. 20 is a diagram showing a state in which a display apparatus is brought into a portrait viewing mode according to the first embodiment of the present disclosure.
Figure 21:
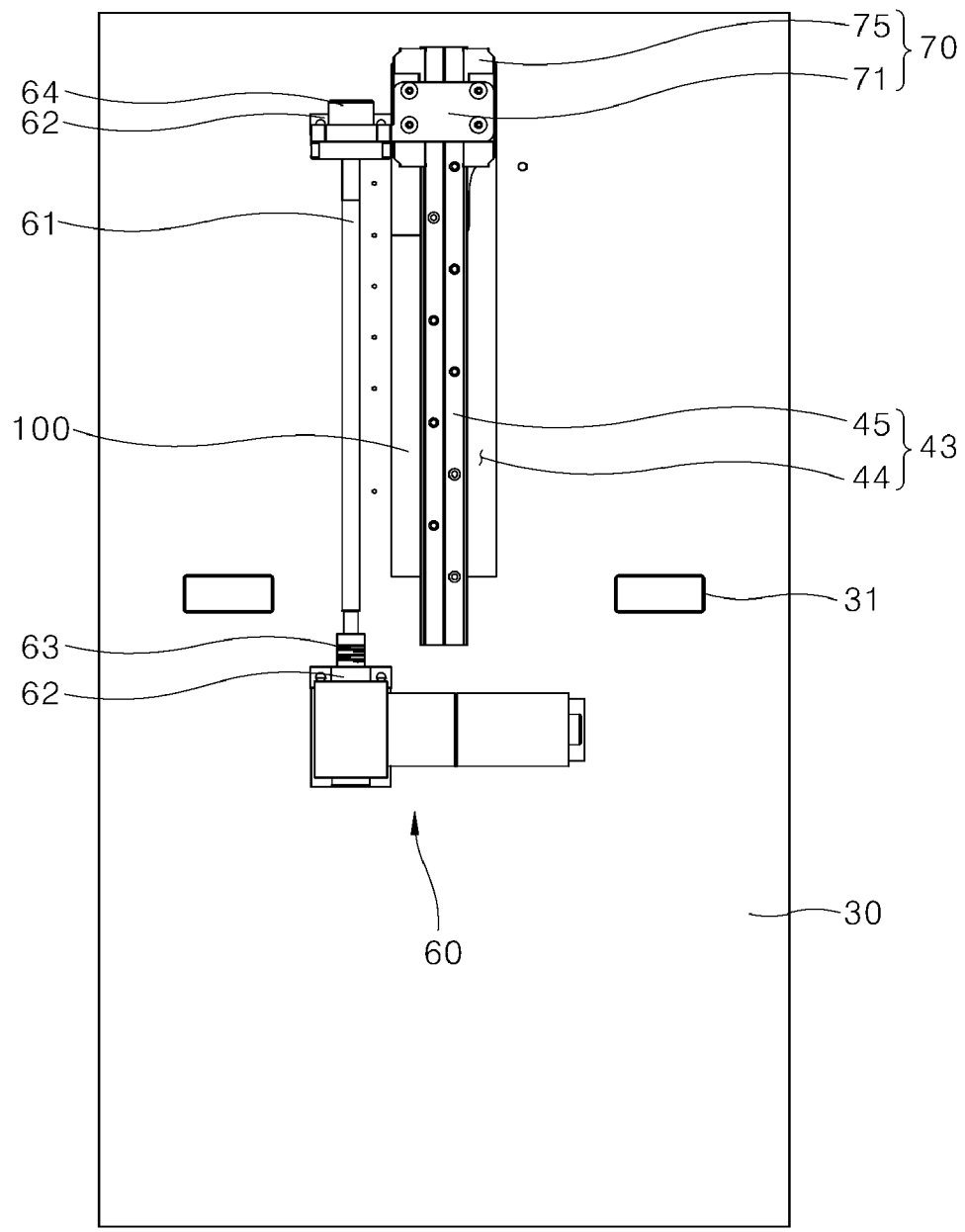
FIG. 21 is a diagram showing a state in which a first movable body is placed at a top level of a guiding member according to the first embodiment of the present disclosure.

FIG. 19 is a diagram showing a state in which the rotatable cam structure 100 is in contact with the third guiding protrusion 140 and is brought into the portrait viewing mode according to the first embodiment of the present disclosure. FIG. 20 is a diagram showing a state in which the display apparatus 1 according to the first embodiment of the present disclosure is brought into a portrait viewing mode. FIG. 21 is a diagram showing a state in which the first movable body 70 is placed at a top level of the guiding member 43 according to the first embodiment of the present disclosure.

As shown in FIG. 19 to FIG. 21, the second cam protrusion 107 of the rotatable cam structure 100 which moves upwards together with the rotation support shaft 83 is in contact with the third guiding protrusion 140 and thus further rotates in the counterclockwise direction (FIG. 19). Therefore, when a top face of the second cam protrusion 107 contacts the third guiding protrusion 140, the rotatable cam structure 100 has stopped such that the portrait viewing mode is maintained. The second cam protrusion 107 is oriented in the horizontal direction as the second direction (A2), and the first cam protrusion 105 is oriented in a downward direction.

The display module 10 moves upward together with the rotatable cam structure 100 and rotates by 90 degrees. Thus, the viewing mode is converted to the portrait viewing mode.

Figure 22:
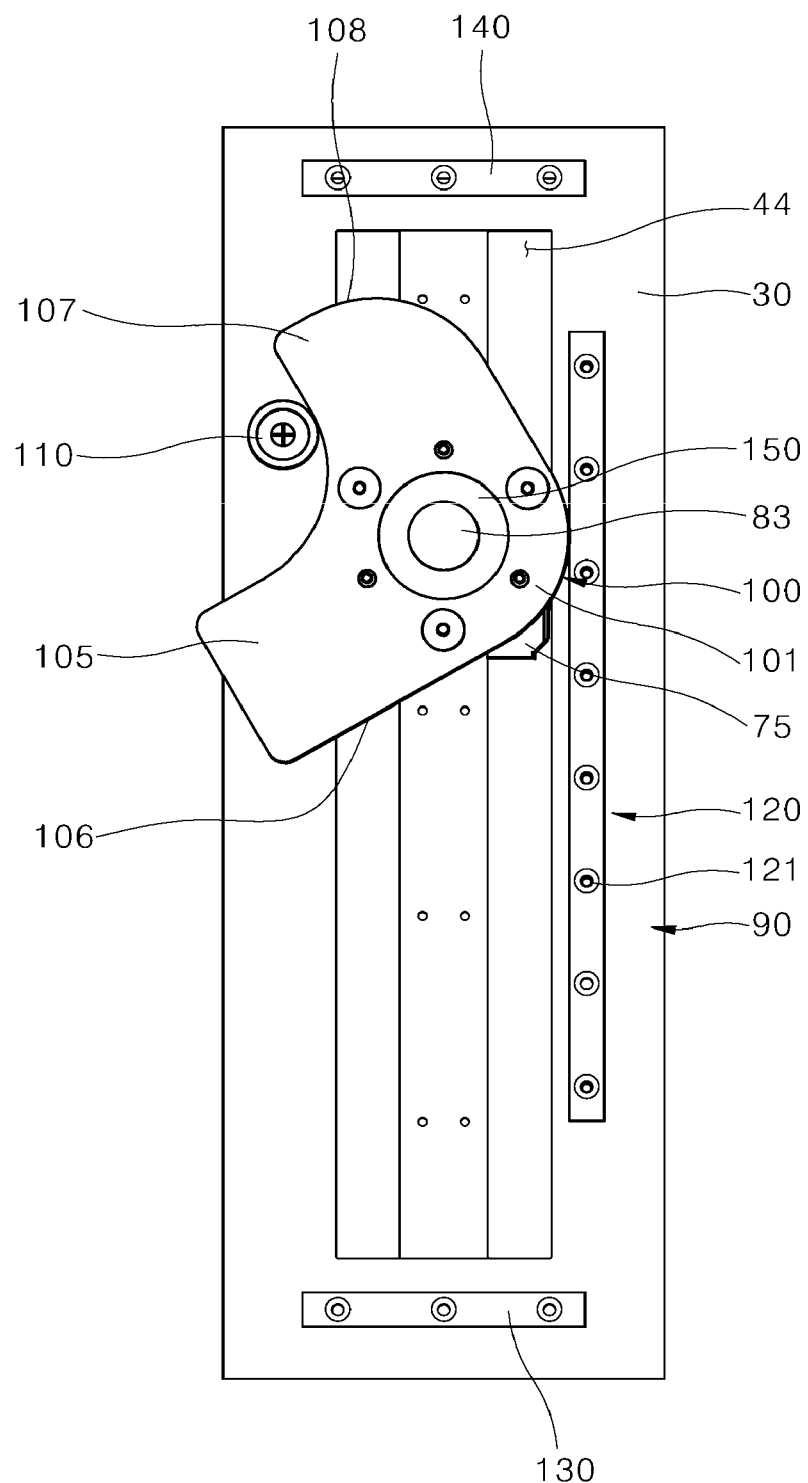
FIG. 22 is a diagram showing a state in which the rotatable cam structure is caught on and rotated by the rotation-inducing protrusion when the rotatable cam structure moves downward according to the first embodiment of the present disclosure.

FIG. 22 is a diagram showing a state in which the rotatable cam structure 100 is caught on and rotates by the rotation-inducing protrusion 110 when the rotatable cam structure 100 moves downward according to the first embodiment of the present disclosure.

As shown in FIG. 22, when the rotatable cam structure 100 moves down, the second cam protrusion 107 is caught on the rotation-inducing protrusion 110. Therefore, the rotatable cam structure 100 rotates clockwise around the rotation support shaft 83.

Figure 23:
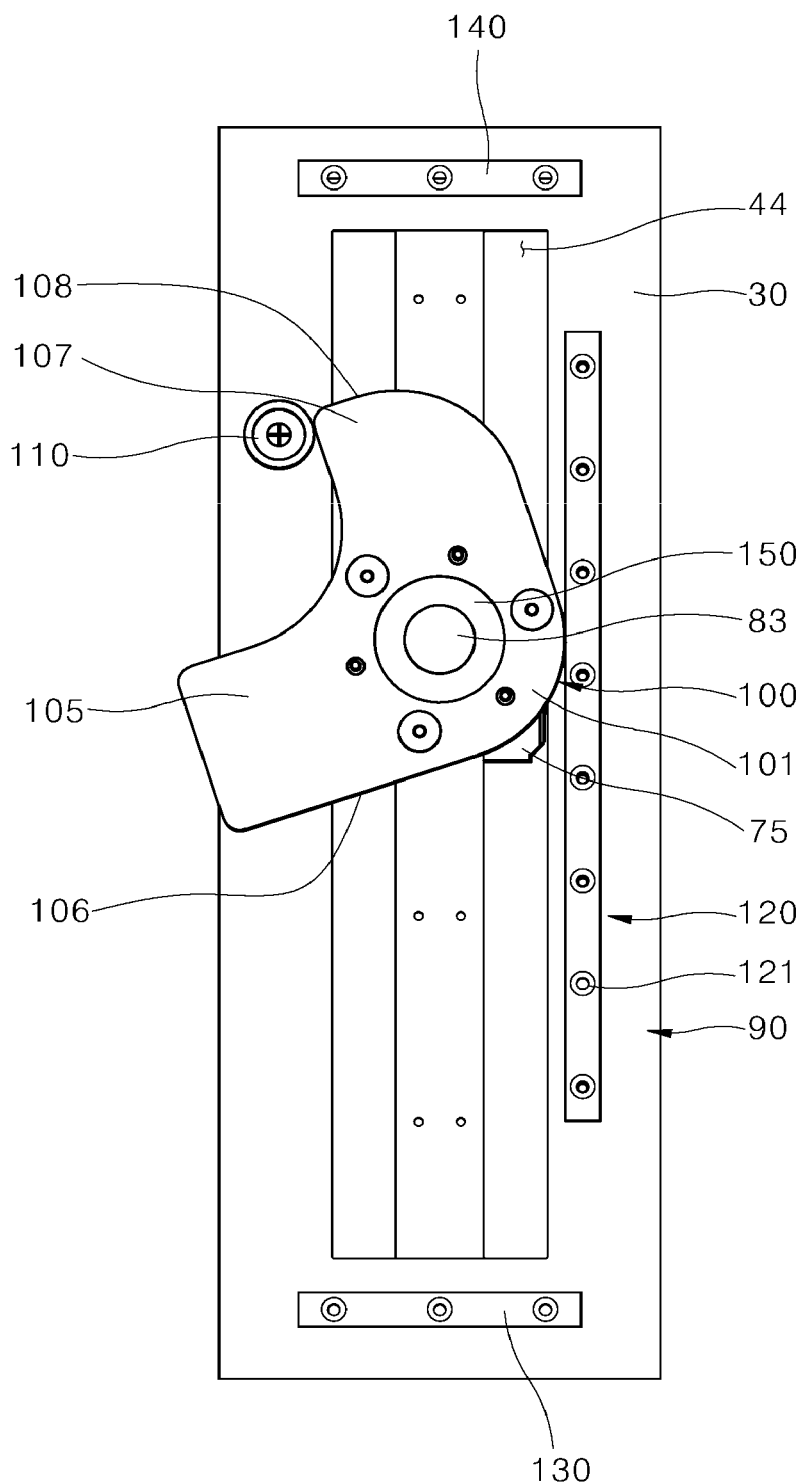
FIG. 23 is a diagram showing a state in which the rotatable cam structure descends while the cam has rotated by the rotation-inducing protrusion according to the first embodiment of the present disclosure.

FIG. 23 is a diagram showing a state in which the rotatable cam structure 100 descends while having been rotated by the rotation-inducing protrusion 110 according to the first embodiment of the present disclosure. As shown in FIG. 23, when the rotatable cam structure 100 passes by the rotation-inducing protrusion 110 and moves downward, the cam 100 moves downward while the side face thereof is guided by the first guiding protrusion 121.

Figure 24:
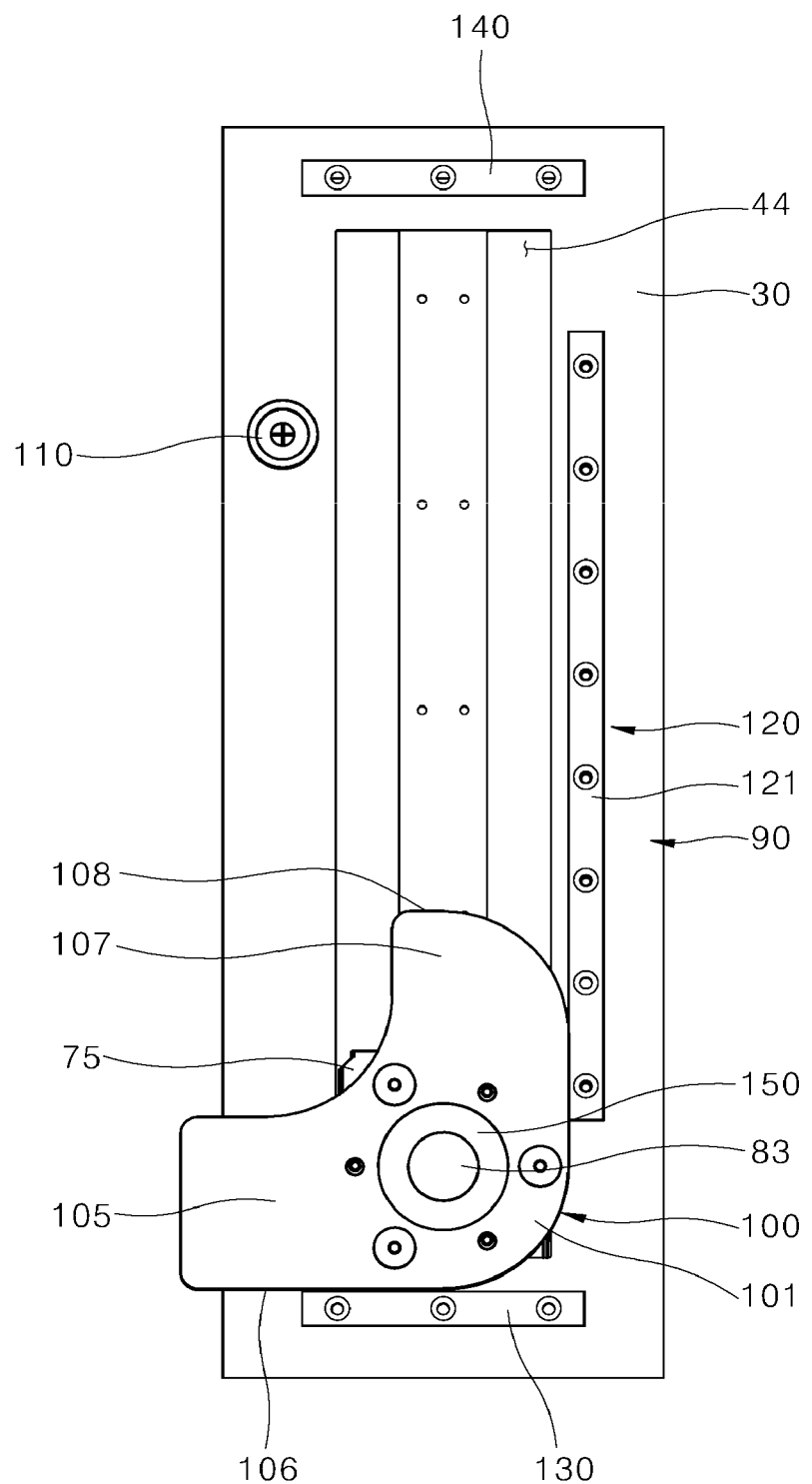
FIG. 24 is a view showing a state in which the rotatable cam structure descends and is in contact with a second guiding protrusion, so that the display module is brought into a landscape viewing mode according to the first embodiment of the present disclosure.

FIG. 24 is a diagram showing a state in which the rotatable cam structure 100 descends and is in contact with the second guiding protrusion 130, so that the viewing mode is brought into a landscape viewing mode according to the first embodiment of the present disclosure. As shown in FIG. 24, the first cam side face 106 of the first cam protrusion 105 touches the second guiding protrusion 130, and thus the rotatable cam structure 100 rotates in a clockwise direction.

Therefore, when the bottom side face of the first cam protrusion 105 is in contact with the second guiding protrusion 130, the rotatable cam structure 100 has stopped such that the viewing mode is maintained in the landscape viewing mode. The first cam protrusion 105 is oriented in the horizontal direction as the second direction (A2), while the second cam protrusion 107 is oriented in the upward direction.

The display module 10 moves downward together with the rotatable cam structure 100 and rotates by 90 degrees, so that the viewing mode is changed to the landscape viewing mode.

The display module 10 according to the first embodiment of the present disclosure can use a lightweight OLED module. Moreover, according to the present disclosure, the device is capable of moving the display module 10 upward or downward. Moreover, the device according to the present disclosure is capable of rotating the display module 10, thus satisfying viewing preferences of various consumers.

Moreover, the display apparatus 1 according to the present disclosure can move to any place in a house due to a relatively lower weight thereof, and can be used in both of the wall mounted mode and the standing mode.

Second Embodiment

Hereinafter, a guiding assembly 220 according to the second embodiment of the present disclosure will be described with reference to the drawings.

For the convenience of description, components having the same configuration and operation as those of the first embodiment of the present disclosure use the same reference numbers, and detailed descriptions thereof are omitted or briefly provided.

Figure 26:
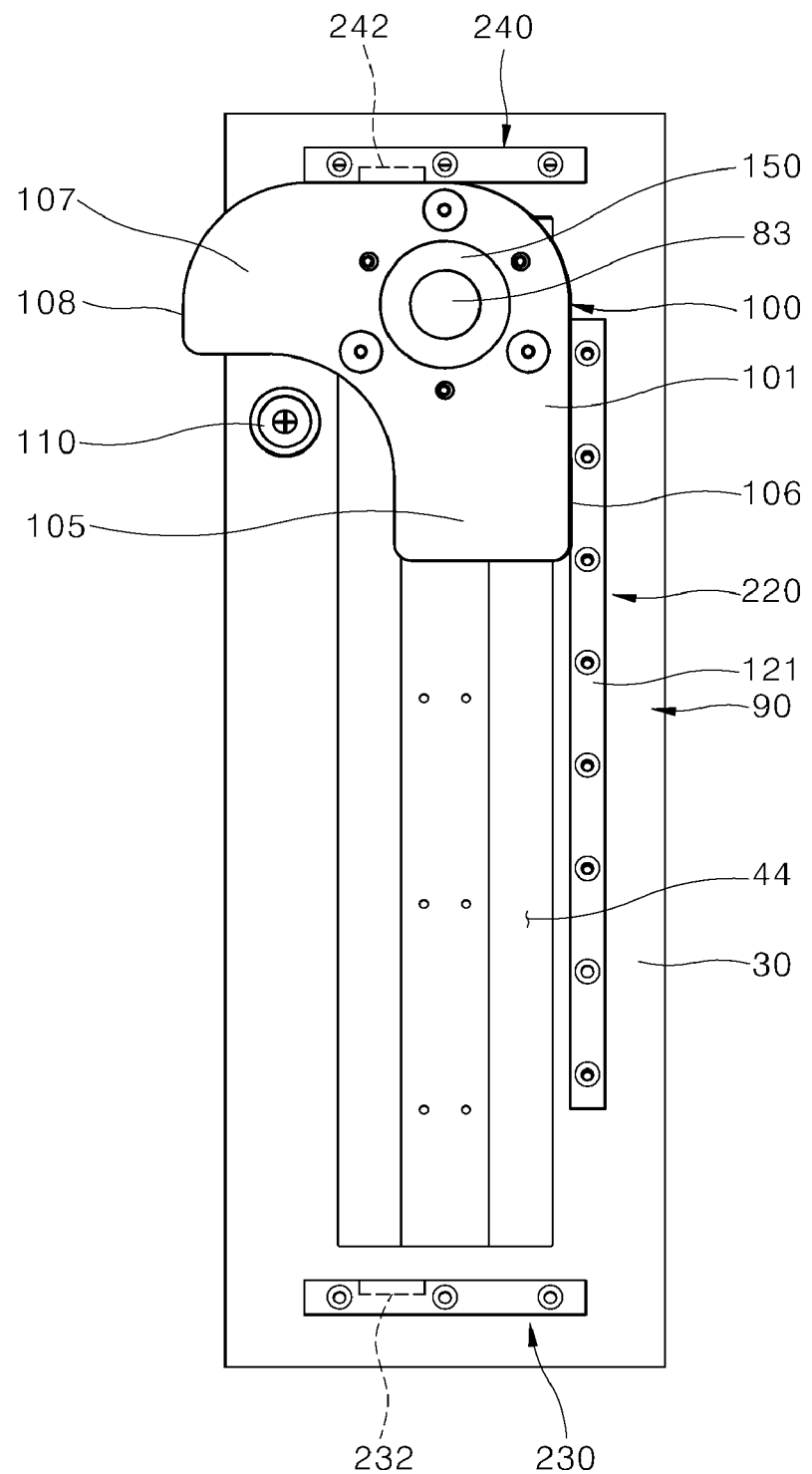
FIG. 26 is a diagram showing a guiding assembly according to a second embodiment of the present disclosure.

FIG. 26 is a diagram showing the guiding assembly 220 according to the second embodiment of the present disclosure.

As shown in FIG. 26, the guiding assembly 220 according to the second embodiment of the present disclosure includes a first sensor member 232 and a second sensor member 242 to detect the movement of the rotatable cam structure 100. The guiding assembly 220 according to the second embodiment of the present disclosure includes a first guiding protrusion 121, a second guiding protrusion 230, the first sensor member 232, a third guiding protrusion 240 and the second sensor member 242.

The first guiding protrusion 121 extends along the first direction (A1), and has the same configuration as that in the first embodiment of the present disclosure. Thus, a detailed description thereof is omitted or briefly provided.

The second guiding protrusion 230 is located below the first guiding protrusion 121 and extends in a direction intersecting with the extension direction of the first guiding protrusion 121. The second guiding protrusion 230 is positioned at a bottom level of the vertically elongate guide hole 44 and extends in the horizontal direction.

The first sensor member 232 is installed on a top face of the second guiding protrusion 230 which will be in contact with the rotatable cam structure 100. The top faces of the first sensor member 232 and the second guiding protrusion 230 are flush with each other. The first sensor member 232 can measure whether the rotatable cam structure 100 contacts the second guiding protrusion 230 in a contact manner. Alternatively, the first sensor member 232 can operate in a non-contact manner to measure whether the rotatable cam structure 100 contacts the second guiding protrusion 230.

The third guiding protrusion 240 is located above the first guiding protrusion 121 and extends in a direction intersecting with the extension direction of the first guiding protrusion 121. The third guiding protrusion 240 is located at the top level of the vertically elongate guide hole 44, and extends in the horizontal direction.

The second sensor member 242 is installed on a bottom face of the third guiding protrusion 240 which will be in contact with the rotatable cam structure 100. The bottom faces of the second sensor member 242 and the third guiding protrusion 240 are flush with each other. The second sensor member 242 can measure whether the rotatable cam structure 100 contacts the third guiding protrusion 240 in a contact manner. Alternatively, the second sensor member 242 can operate in a non-contact manner to measure whether the rotatable cam structure 100 is in contact with the third guiding protrusion 240.

Therefore, when the rotatable cam structure 100 contacts the second guiding protrusion 230 and thus the viewing mode is brought into a landscape viewing mode, the first sensor member 232 is activated. The first sensor member 232 detects that the rotatable cam structure 100 comes into contact with the second guiding protrusion 230, thereby to quickly and easily identify an abnormality in the operation of the device.

Moreover, when the rotatable cam structure 100 contacts the third guiding protrusion 240 and thus the viewing mode is brought into the portrait viewing mode, the second sensor member 242 is activated. The second sensor member 242 detects that the rotatable cam structure 100 is in contact with the third guiding protrusion 240, thereby to quickly and easily identify malfunctions of the device.

Third Embodiment

Hereinafter, a guiding assembly 320 according to the third embodiment of the present disclosure will be described with reference to the drawings.

For the convenience of description, components having the same configuration and operation as those of the first embodiment of the present disclosure use the same reference numbers, and detailed descriptions thereof are omitted or briefly provided.

Figure 27:
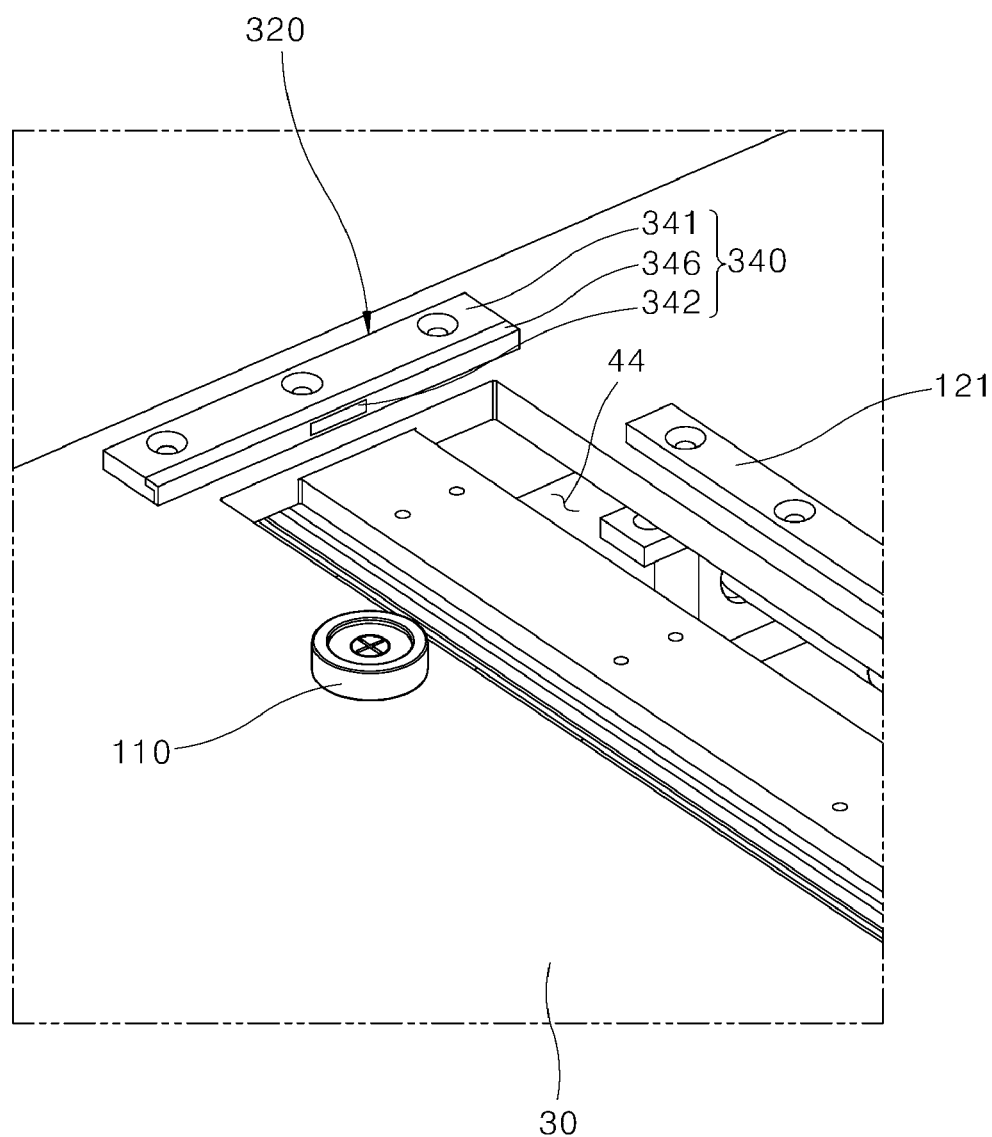
FIG. 27 is a perspective view showing a guiding assembly according to a third embodiment of the present disclosure.

FIG. 27 is a perspective view showing the guiding assembly 320 according to the third embodiment of the present disclosure.

As shown in FIG. 27, the guiding assembly 320 according to the third embodiment of the present disclosure includes a function of detecting the movement of the rotatable cam structure 100 and a function of absorbing the shock caused by the rotatable cam structure 100. The guiding assembly 320 according to the third embodiment of the present disclosure includes the first guiding protrusion 121, a third guiding protrusion 340, a guiding protrusion body 341, a second sensor member 342, and a shock-absorbing member 346.

The first guiding protrusion 121 extends along the first direction (A1), and has the same configuration as that in the first embodiment of the present disclosure. Thus, a detailed description thereof is omitted or briefly provided.

The third guiding protrusion 340 is located above the first guiding protrusion 121 and extends in a direction intersecting with the extension direction of the first guiding protrusion 121. The third guiding protrusion 340 according to the third embodiment of the present disclosure includes a guiding protrusion body 341 located at the top level of the vertically elongate guide hole 44 and extending in a horizontal direction, the shock-absorbing member 346 installed to surround a bottom face of the guiding protrusion body 341, and the second sensor member 342 installed on a bottom face of the shock-absorbing member 346.

Since the guiding protrusion body 341 facing the shock-absorbing member 346 has a stepped shape, a contact area between the shock-absorbing member 346 and the guiding protrusion body 341 increases. Therefore, a bonding strength between the shock-absorbing member 346 and the guiding protrusion body 341 can be improved.

The shock-absorbing member 346 is made of a material having elasticity such as rubber or urethane. Therefore, when the rotatable cam structure 100 comes into contact with the shock-absorbing member 346, the member 346 can reduce occurrence of shock and noise. The second sensor member 342 is installed on the bottom face of the shock-absorbing member 346. The bottom faces of the second sensor member 342 and the shock-absorbing member 346 are flush with each other.

Moreover, the second guiding protrusion 130 having the same structure as the third guiding protrusion 340 can be opposite to the third guiding protrusion 340.

Fourth Embodiment

Hereinafter, a guiding assembly 420 according to the fourth embodiment of the present disclosure will be described with reference to the drawings.

For the convenience of description, components having the same configuration and operation as those of the first embodiment of the present disclosure use the same reference numbers, and detailed descriptions thereof are omitted or briefly provided.

Figure 28:
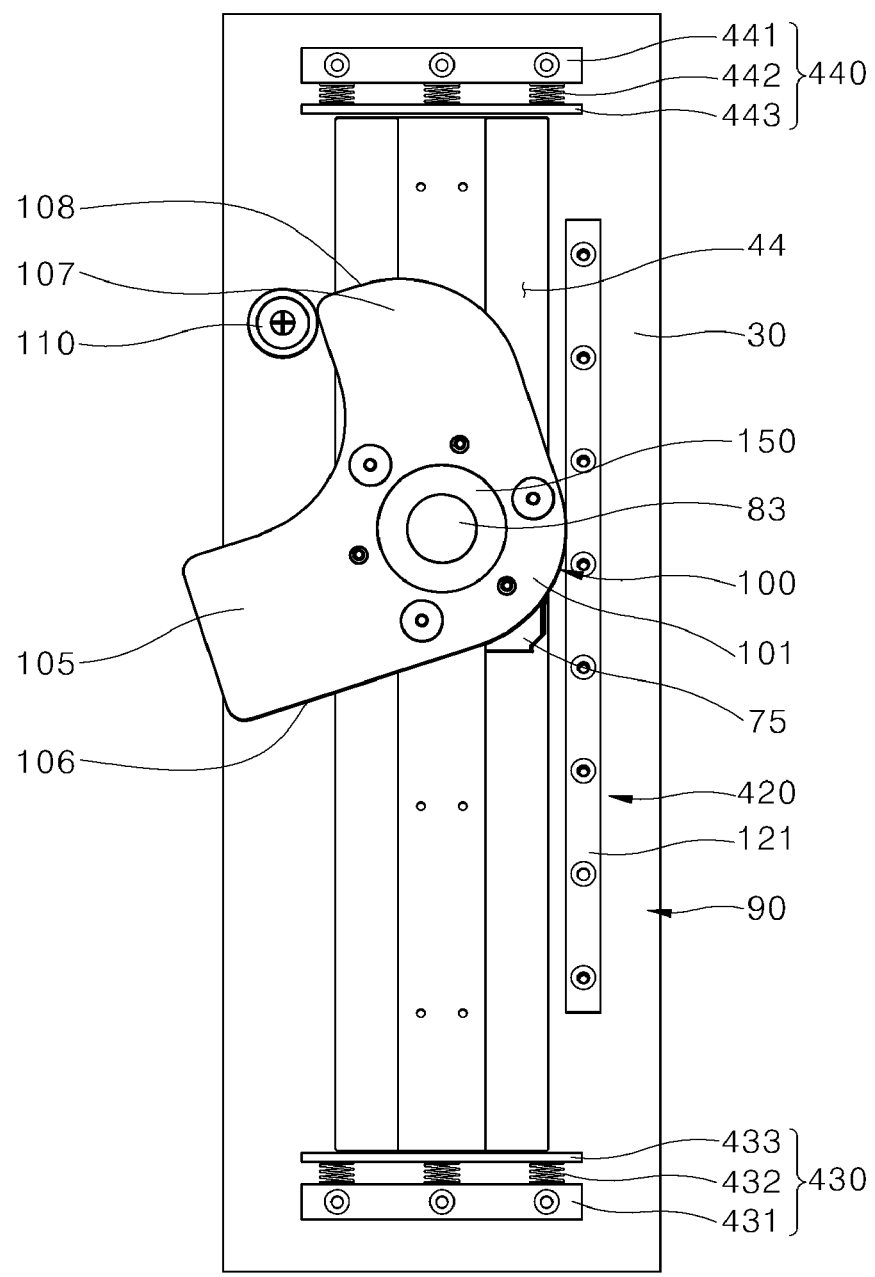
FIG. 28 is a diagram showing a guiding assembly according to a fourth embodiment of the present disclosure.

FIG. 28 is a diagram showing the guiding assembly 420 according to the fourth embodiment of the present disclosure.

As shown in FIG. 28, the guiding assembly 420 according to the fourth embodiment of the present disclosure includes the first guiding protrusion 121, a second guiding protrusion 430, and the third guiding protrusion 440.

The first guiding protrusion 121 extends along the first direction (A1), and has the same configuration as that in the first embodiment of the present disclosure. Thus, a detailed description thereof is omitted or briefly provided.

The second guiding protrusion 430 is located below the first guiding protrusion 121 and extends in a direction intersecting with the extension direction of the first guiding protrusion 121. The second guiding protrusion 430 according to the fourth embodiment of the present disclosure includes a second guiding protrusion body 431 located at a bottom level of the vertically elongate guide hole 44 and extending in a horizontal direction, a second support plate 433 located above the second guiding protrusion body 431 and movable by the rotatable cam structure 100, and a second elastically-deformable member 432 located between the second guiding protrusion body 431 and the second support plate 433 and elastically supporting the second support plate 433. The second elastically-deformable member 432 can be embodied as various elastic members including a coil spring.

The third guiding protrusion 440 is located above the first guiding protrusion 121 and extends in a direction intersecting with the extension direction of the first guiding protrusion 121. The third guiding protrusion 440 according to the fourth embodiment of the present disclosure includes a third guiding protrusion body 441 located at a top level of the vertically elongate guide hole 44 and extending in a horizontal direction, a third support plate 443 located below the third guiding protrusion body 441 and movable by the rotatable cam structure 100, and a third elastically-deformable member 442 is located between the third guiding protrusion body 441 and the third support plate 443 and elastically supporting the third support plate 443. The third elastically-deformable member 442 can be embodied as various elastic members including coil springs.

Therefore, when the rotatable cam structure 100 touches the second guiding protrusion 430, the cam 100 presses the second support plate 433 and moves the plate 433 downward. At this time, the second elastically-deformable member 432 is deformed and absorbs the shock caused by the downward movement of the rotatable cam structure 100. Thus, noise and vibration generation can be reduced.

Moreover, when the rotatable cam structure 100 touches the third guiding protrusion 440, the cam 100 can press the third support plate 443 and can move the plate 443 upwards. At this time, the third elastically-deformable member 442 is deformed and absorbs the shock caused by the upward movement of the rotatable cam structure 100. Thus, noise generation and vibration generation can be reduced.

Effects

As described above, according to the present disclosure, the display module 10 rotates to switch to a landscape viewing mode or a portrait viewing mode. Thus, various consumer preferences can be satisfied. Moreover, when the rotatable cam structure 100 receives the power of the driver 50, the rotation of the cam 100 can be guided by the rotation-inducing protrusion 110 and the guiding assembly 420. Thus, the rotation of the display module 10 that outputs the image is easily made. Thus, the time and cost needed for the rotation of the display module 10 can be saved. Moreover, since the support assembly 20 supporting the display module 10 can be changed to a standing mode or the wall-mounted mode, an installation cost can be reduced. Moreover, since the first and second controllers are respectively installed on the display module 10 and the support assembly 20, the display module 10 can be lightened and a simple maintenance structure can be provided, thereby reducing the maintenance cost. Moreover, the rotatable cam structure 100 which can move under the power of the driver 50, and the swing bracket 161 connected to the display module 10 are interconnected to each other under the magnetic force and using the fitting structure, thus reducing the time and cost needed for removing the display module 10 therefrom.

In addition to the effects as described above, specific effects in accordance with the present disclosure will be described together with the above detailed descriptions for carrying out the disclosure.

As described above, the present disclosure is described with reference to the drawings. However, the present disclosure is not limited to the embodiments and drawings disclosed in the present specification. It will be apparent that various modifications can be made thereto by those skilled in the art within the scope of the present disclosure. Furthermore, although the effect resulting from the features of the present disclosure has not been explicitly described in the description of the embodiments of the present disclosure, it is obvious that a predictable effect resulting from the features of the present disclosure should be recognized.

What is claimed is:

1. A display apparatus comprising:
a display module configured to display an image;
a support assembly facing toward the display module;
a linearly-movable assembly configured to perform linear movement under power from a driver installed on the support assembly; and
a rotation guiding mechanism configured to connect the linearly-movable assembly to the display module, and induce rotation of the display module using movement of the linearly-movable assembly,
wherein the rotation guiding mechanism is configured to guide the display module to rotate so that a viewing mode of the display module switches to a first mode or a second mode, and
wherein the rotation guiding mechanism includes:
a rotatable cam structure rotatably coupled to the linearly-movable assembly, and including a plurality of protrusions;
a rotation-inducing protrusion fixed to the support assembly and located in a movement path of the rotatable cam structure, wherein the rotation-inducing protrusion contacts the rotatable cam structure to induce a rotation of the rotatable cam structure; and
a guiding assembly fixed to the support assembly and extending along the movement path of the rotatable cam structure, wherein the guiding assembly is in contact with a side face of the rotatable cam structure to induce the rotation of the rotatable cam structure so that the viewing mode of the display module switches to the first mode or the second mode.

2. The display apparatus of claim 1, wherein the first mode is a landscape viewing mode in which a horizontal dimension of the display module is larger than a vertical dimension of the display module, and
wherein the second mode is a portrait viewing mode in which the horizontal dimension of the display module is smaller than the vertical dimension of the display module.

3. The display apparatus of claim 1, wherein the rotatable cam structure includes:
a cam body having a cam hole defined therein and rotatably coupled to the linearly-movable assembly;
a first cam protrusion protruding outwardly from the cam body; and
a second cam protrusion protruding outwardly from the cam body,
wherein protrusion extensions of the first cam protrusion and the second cam protrusion intersect with each other, and
wherein the first cam protrusion or the second cam protrusion is rotated by the rotation-inducing protrusion.

4. The display apparatus of claim 1, wherein the support assembly includes:
a first support body located on a rear face of the display module;
a second support body facing toward the first support body; and
a hinge-type connector connected to the first support body and the second support body,
wherein each of the first support body and the second support body pivots around the hinge-type connector.

5. The display apparatus of claim 1, wherein the display module includes a first controller installed on the display module and movable together with the display module, and
wherein the first controller is configured to control an operation of the display module.

6. The display apparatus of claim 5, wherein the support assembly includes:
a first support body located on a rear face of the display module; and
a second controller fixed to the first support body and connected to the first controller.

7. A display apparatus comprising:
a display module including a display panel configured to display an image, and a support panel located on a rear face of the display panel to support the display panel;
a support assembly facing toward the display module;
a driver installed on the support assembly for supplying power to rotate the display module;
a linearly-movable assembly connected to the driver to receive the power therefrom, wherein the linearly-movable assembly performs linear movement in a first direction and along the support assembly; and
a rotation guiding mechanism configured to connect the linearly-movable assembly to the display module, and induce rotation of the display module under the movement of the linearly-movable assembly,
wherein the display module is moved in a linear direction using the linearly-movable assembly, and is rotated using a cam structure of the rotation guiding mechanism, and
wherein the rotation guiding mechanism includes:
a rotatable cam structure rotatably coupled to the linearly-movable assembly, and including a plurality of protrusions;
a rotation-inducing protrusion fixed to the support assembly and located in a movement path of the rotatable cam structure, wherein the rotation-inducing protrusion contacts the rotatable cam structure to induce a rotation of the rotatable cam structure; and
a guiding assembly fixed to the support assembly and extending along the movement path of the rotatable cam structure, wherein the guiding assembly is in contact with a side face of the rotatable cam structure to induce the rotation of the rotatable cam structure so that a viewing mode of the display module switches to a first mode or a second mode.

8. The display apparatus of claim 7, wherein the rotatable cam structure includes:
a cam body having a cam hole defined therein and rotatably coupled to the linearly-movable assembly;
a first cam protrusion protruding outwardly from the cam body; and
a second cam protrusion protruding outwardly from the cam body,
wherein protrusion extensions of the first cam protrusion and the second cam protrusion intersect with each other, and
wherein the first cam protrusion or the second cam protrusion is caught on and thus is rotated by the rotation-inducing protrusion.

9. The display apparatus of claim 7, wherein the guiding assembly includes:

a first guiding protrusion installed to be opposite to the rotation-inducing protrusion while the rotatable cam structure is disposed therebetween, wherein the first guiding protrusion extends in a first direction, and comes into contact with the rotatable cam structure to guide movement of the rotatable cam structure moving in the first direction;

a second guiding protrusion located on one end of the first guiding protrusion, and extending in a second direction intersecting the first direction, wherein the second guiding protrusion guides the rotatable cam structure to rotate so that the viewing mode is brought into the first mode; and a third guiding protrusion located on the opposite end of the first guiding protrusion, and extending in the second direction intersecting the first direction, wherein the third guiding protrusion guides the rotatable cam structure to rotate so that the viewing mode is brought into the second mode.

10. The display apparatus of claim 9, wherein the second guiding protrusion and the third guiding protrusion extend in a parallel manner to each other and are opposite to each other, and extend in the second direction intersecting the first direction.

11. The display apparatus of claim 7, wherein the rotation guiding mechanism further includes a panel connector for connecting the rotatable cam structure to the display module, and for synchronizing rotations of the rotatable cam structure and the display module with each other.

12. The display apparatus of claim 11, wherein the panel connector includes:

a swing bracket fixed to a face of the display module facing toward the rotatable cam structure;

a first fixed member fixed to the swing bracket; and a second fixed member fixed to a face of the rotatable cam structure facing toward the first fixed member, wherein at least one of the first fixed member or the second fixed member has magnetism, and is fixed thereto using a magnetic force.

13. The display apparatus of claim 7, wherein the support assembly further includes a guiding member for guiding the linear movement of the linearly-movable assembly.

14. The display apparatus of claim 13, wherein the guiding member includes:

a guide rail extending along a moving path of the linearly-movable assembly; and a guide hole defined on each of both opposing sides of the guide rail, wherein the guide hole is elongate along the guide rail, wherein the linearly-movable assembly is constructed to extend through the guide hole and surround the guide rail, and moves in the first direction and along the guide rail.

15. A display apparatus comprising:

a display module including a display panel configured to display an image, and a support panel located on a rear face of the display panel to support the display panel;

a support assembly facing toward the display module;

a driver installed on the support assembly for supplying power to rotate the display module;

a linearly-movable assembly connected to the driver to receive the power therefrom, wherein the linearly-movable assembly performs linear movement in a first direction and along the support assembly;

a rotation guiding mechanism configured to connect the linearly-movable assembly to the display module, and induce rotation of the display module under the movement of the linearly-movable assembly; and a guiding member for guiding the linear movement of the linearly-movable assembly, wherein the display module is moved in a linear direction using the linearly-movable assembly, and is rotated using a cam structure of the rotation guiding mechanism, wherein the guiding member includes:

a guide rail extending along a moving path of the linearly-movable assembly; and a guide hole defined on each of both opposing sides of the guide rail, wherein the guide hole is elongate along the guide rail, wherein the linearly-movable assembly is constructed to extend through the guide hole and surround the guide rail, and moves in the first direction and along the guide rail, and wherein the linearly-movable assembly includes:

a screw bar rotating upon receiving the power of the driver, wherein a thread is formed on an outer face of the screw bar;

a ball nut engaged with the thread and installed on the outer face of the screw bar, wherein the ball nut moves in the first direction under rotation of the screw bar;

a first movable body coupled to the ball nut and movable together with the ball nut and along the guide rail; and a second movable body extending through the guide hole and having one side connected to the first movable body, and the opposite side connected to the rotation guiding mechanism.

16. The display apparatus of claim 15, wherein the first movable body includes:

a movable bracket connected to the ball nut and movable, in the first direction, together with the ball nut; and a movable block caught on an outer face of the guide rail, and constructed to slide along the guide rail, and connected to the movable bracket.

17. The display apparatus of claim 16, wherein the guide rail includes a pair of guide rails arranged side by side and extending in the first direction, wherein the movable block includes a pair of movable blocks, and wherein each movable block is constructed to be caught on the outer face of each guide rail.

18. The display apparatus of claim 15, wherein the second movable body includes:

a slidable body installed to face toward the first movable body while the support assembly is interposed therebetween;

a side member extending from each of opposing sides of the slidable body and toward the first movable body, wherein the side member is fixed to the first movable body; and a rotation support shaft protruding from the slidable body toward the display module.

* * * * *